(12) United States Patent
Zhang et al.

(10) Patent No.: US 8,916,410 B2
(45) Date of Patent: Dec. 23, 2014

(54) METHODS OF MANUFACTURING LIGHT TO CURRENT CONVERTER DEVICES

(75) Inventors: Lingjun Zhang, Suzhou (CN); Feng Zhang, Suzhou (CN); Jian Wu, Suzhou (CN); Xusheng Wang, Suzhou (CN)

(73) Assignee: CSI Cells Co., Ltd, Suzhou (CN)

( * ) Notice: Subject to any disclaimer, the term of this patent is extended or adjusted under 35 U.S.C. 154(b) by 381 days.

(21) Appl. No.: 13/193,458

(22) Filed: Jul. 28, 2011

(65) Prior Publication Data

US 2012/0301997 A1    Nov. 29, 2012

(30) Foreign Application Priority Data

| May 27, 2011 | (CN) | 2011 1 0141248 |
| May 27, 2011 | (CN) | 2011 1 0141250 |
| May 27, 2011 | (CN) | 2011 1 0141259 |
| May 27, 2011 | (CN) | 2011 1 0141575 |
| May 27, 2011 | (CN) | 2011 1 0141621 |
| May 27, 2011 | (CN) | 2011 2 0175836 |
| May 27, 2011 | (CN) | 2011 2 0176094 |

(51) Int. Cl.
*H01L 21/00* (2006.01)
*H01L 31/0224* (2006.01)
*H01L 31/18* (2006.01)

(52) U.S. Cl.
CPC ...... *H01L 31/02245* (2013.01); *H01L 31/1804* (2013.01); *Y02E 10/542* (2013.01); *Y02E 10/547* (2013.01)
USPC ..................................... 438/72; 257/E31.127

(58) Field of Classification Search
USPC .................. 438/98, 72, 76, 71; 257/E31.127, 257/E31.097, E27.124–E27.126, E31.124, 257/E31.119; 136/256
See application file for complete search history.

(56) References Cited

U.S. PATENT DOCUMENTS

| 3,903,428 A | 9/1975 | DeJong |
| 4,104,091 A | 8/1978 | Evans, Jr. et al. |

(Continued)

FOREIGN PATENT DOCUMENTS

| CA | 2530684 A1 | 1/2005 |
| CA | 2530743 A1 | 2/2005 |

(Continued)

OTHER PUBLICATIONS

Sinton, R.A. (Oct. 1986). "27.5-Percent Silicon Concentrator Solar Cell," *IEEE Electron Device Letters* ED-7(10):567-569.

(Continued)

*Primary Examiner* — William F Kraig
*Assistant Examiner* — Latanya N Crawford
(74) *Attorney, Agent, or Firm* — Morrison & Foerster LLP

(57) ABSTRACT

Processes for making light to current converter devices are provided. The processes can be used to make light to current converter devices having P-N junctions located on only the top surface of the cell, located on the top surface and symmetrically or asymmetrically along a portion of the inner surface of the via holes, located on the top surface and full inner surface of the via holes, or located on the top surface, full inner surface of the via holes, and a portion of the bottom surface of the cell. The processes may isolate the desired P-N junction by etching the emitter, forming a via hole after forming the emitter, using a barrier layer to protect portions of the emitter from etching, or using a barrier layer to prevent the emitter from being formed on portions of the substrate.

40 Claims, 39 Drawing Sheets

(56) References Cited

U.S. PATENT DOCUMENTS

| | | | |
|---|---|---|---|
| 4,227,942 A | 10/1980 | Hall | |
| 4,427,839 A | 1/1984 | Hall | |
| 4,626,613 A | 12/1986 | Wenham et al. | |
| 4,838,952 A | 6/1989 | Dill et al. | |
| 6,384,317 B1 | 5/2002 | Kerschaver et al. | |
| 7,851,696 B2 | 12/2010 | Mueller et al. | |
| 2004/0063326 A1* | 4/2004 | Szlufcik et al. | 438/695 |
| 2009/0084437 A1 | 4/2009 | Nishida et al. | |
| 2009/0178707 A1 | 7/2009 | Moon et al. | |
| 2009/0188550 A1 | 7/2009 | Moon et al. | |
| 2009/0256254 A1 | 10/2009 | Burdick, Jr. et al. | |
| 2010/0218818 A1 | 9/2010 | Kang et al. | |
| 2010/0243040 A1 | 9/2010 | Kim | |
| 2010/0258176 A1* | 10/2010 | Kang et al. | 136/256 |
| 2010/0258177 A1 | 10/2010 | Ko et al. | |
| 2010/0258178 A1 | 10/2010 | Jang et al. | |
| 2010/0275987 A1* | 11/2010 | Sakamoto et al. | 136/256 |
| 2010/0276772 A1 | 11/2010 | Ozaki et al. | |
| 2010/0319766 A1* | 12/2010 | Suh | 136/256 |
| 2010/0326504 A1* | 12/2010 | Park et al. | 136/255 |
| 2011/0000530 A1* | 1/2011 | Mihailetchi | 136/255 |
| 2011/0005582 A1* | 1/2011 | Szlufcik et al. | 136/252 |
| 2011/0041906 A1 | 2/2011 | Jang et al. | |
| 2011/0048529 A1 | 3/2011 | Lee et al. | |
| 2011/0057283 A1 | 3/2011 | Tsunemi et al. | |
| 2011/0120548 A1* | 5/2011 | Chen et al. | 136/256 |
| 2011/0139241 A1 | 6/2011 | Clement et al. | |
| 2011/0174355 A1 | 7/2011 | Biro et al. | |
| 2011/0253211 A1* | 10/2011 | Krokoszinski | 136/256 |
| 2012/0006393 A1* | 1/2012 | Cruz et al. | 136/256 |
| 2012/0138137 A1* | 6/2012 | Chen et al. | 136/256 |
| 2012/0288980 A1* | 11/2012 | Moon et al. | 438/72 |
| 2013/0008501 A1* | 1/2013 | Guillevin et al. | 136/256 |

FOREIGN PATENT DOCUMENTS

| | | |
|---|---|---|
| CA | 2596827 A1 | 8/2005 |
| CN | 101556975 A | 10/2009 |
| CN | 101587922 A | 11/2009 |
| CN | 101889349 A | 11/2010 |
| CN | 101894888 A | 11/2010 |
| CN | 101937945 A | 1/2011 |
| CN | 102208486 A | 10/2011 |
| DE | 10 2008 033 632 A1 | 1/2010 |
| DE | 102008044910 A1 | 3/2010 |
| DE | 102009047778 A1 | 9/2010 |
| EP | 0 985 233 B1 | 2/2007 |
| EP | 2 068 369 A1 | 6/2009 |
| EP | 2 410 574 A2 | 1/2012 |
| JP | 58039071 A2 | 3/1983 |
| JP | 62108579 A | 5/1987 |
| JP | 4223378 A2 | 8/1992 |
| JP | 9150482 A2 | 6/1997 |
| JP | 2000150929 A2 | 5/2000 |
| JP | 2008300440 A | 12/2008 |
| JP | 2009059921 A | 3/2009 |
| JP | 2009088406 A2 | 4/2009 |
| JP | 2009158575 A2 | 7/2009 |
| JP | 2009182260 A2 | 8/2009 |
| JP | 2010080576 A | 4/2010 |
| JP | 2010080578 A | 4/2010 |
| JP | 2010262951 A2 | 11/2010 |
| KR | 20090077529 A | 7/2009 |
| KR | 10-20100098993 A | 9/2010 |
| KR | 100984700 B1 | 10/2010 |
| KR | 10-20100118292 A | 11/2010 |
| KR | 20100123164 A | 11/2010 |
| KR | 2010135618 A | 12/2010 |
| KR | 20110011053 A | 2/2011 |
| KR | 20110024947 A | 3/2011 |
| KR | 101032624 A | 5/2011 |
| NL | 2001015 C2 | 8/2009 |
| WO | WO-9109427 A1 | 6/1991 |
| WO | WO-98/54763 A1 | 12/1998 |
| WO | WO-2009/071561 A2 | 6/2009 |
| WO | WO-2009/071561 A3 | 6/2009 |
| WO | WO-2010/015310 A2 | 2/2010 |
| WO | WO-2010/015310 A3 | 2/2010 |
| WO | WO-2010/022911 A2 | 3/2010 |
| WO | WO-2010/022911 A3 | 3/2010 |
| WO | WO-2010/022911 A8 | 3/2010 |
| WO | WO-2010/022911 C1 | 3/2010 |
| WO | WO-2010/027265 A2 | 3/2010 |
| WO | WO-2010/027265 A3 | 3/2010 |
| WO | WO-2010/097268 A2 | 9/2010 |
| WO | WO-2010/097268 A3 | 9/2010 |
| WO | WO-2010/126346 A2 | 11/2010 |
| WO | WO-2010/126346 A3 | 11/2010 |
| WO | WO-2010/126346 A4 | 11/2010 |

OTHER PUBLICATIONS

U.S. Appl. No. 13/193,433, filed Jul. 28, 2011, by Zhang et al.
U.S. Appl. No. 13/193,470, filed Jul. 28, 2011, by Zhang et al.
Florian Clement et al., Industriallyfeasiblemulti-crystal-linemetalwrapthrough(MWT)silicon solar cellsexceeding16%efficiency, Solar EnergyMaterials&SolarCells, Available online on Jan. 20, 2009.

* cited by examiner

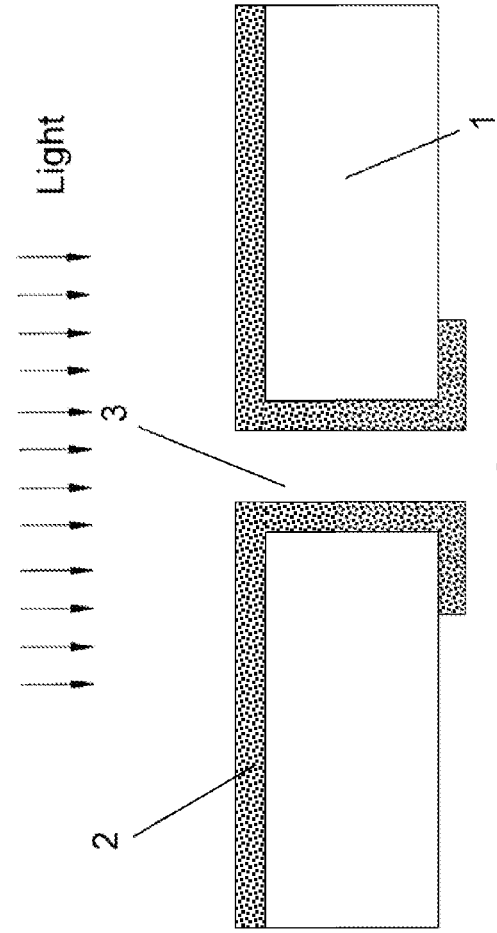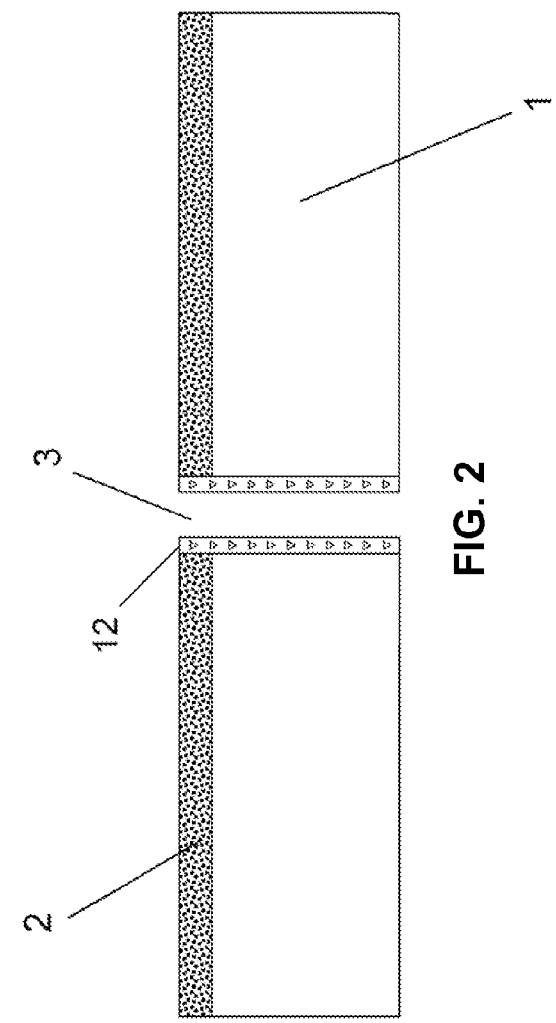

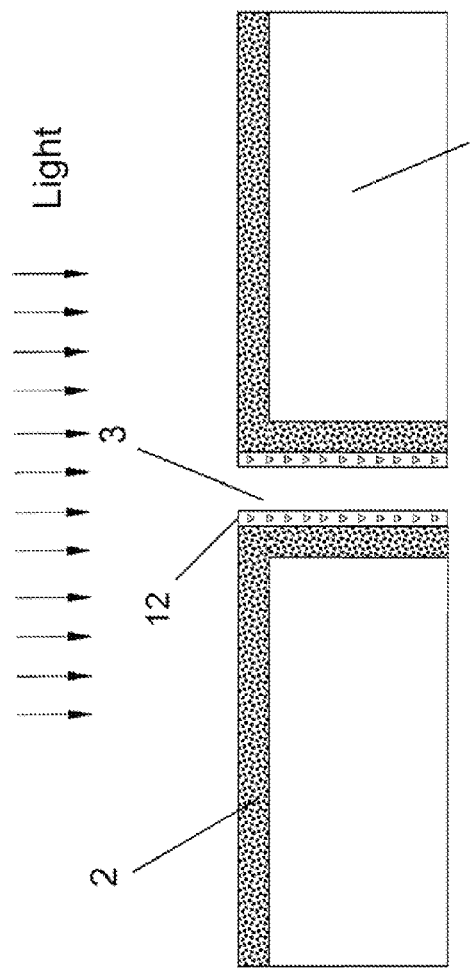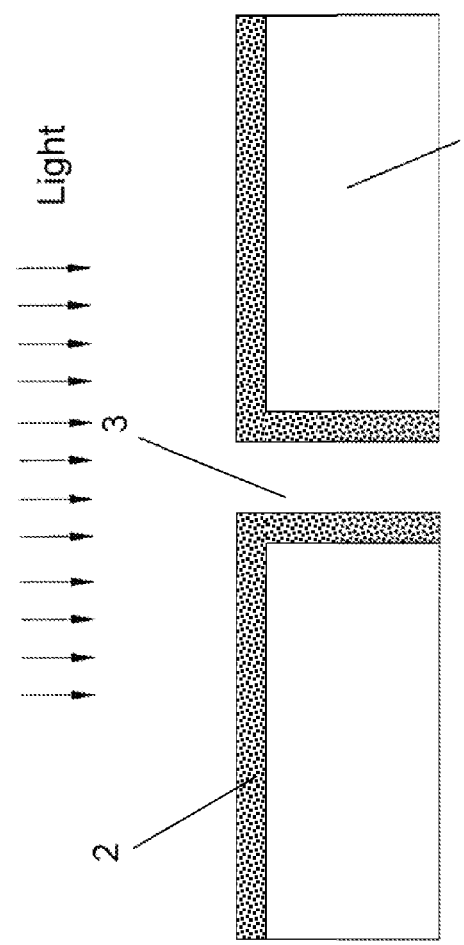

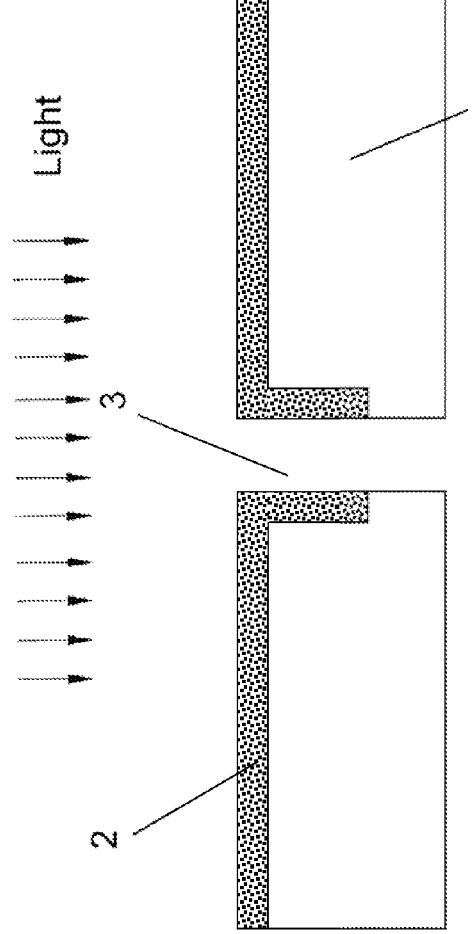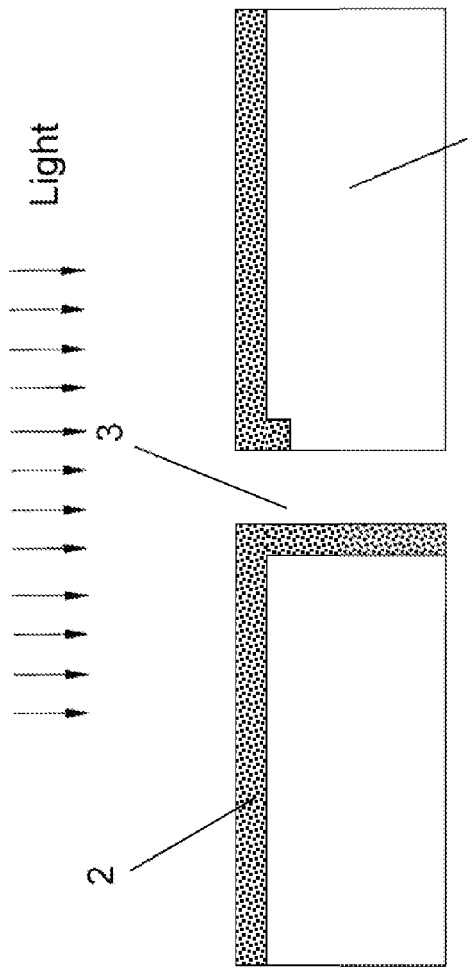

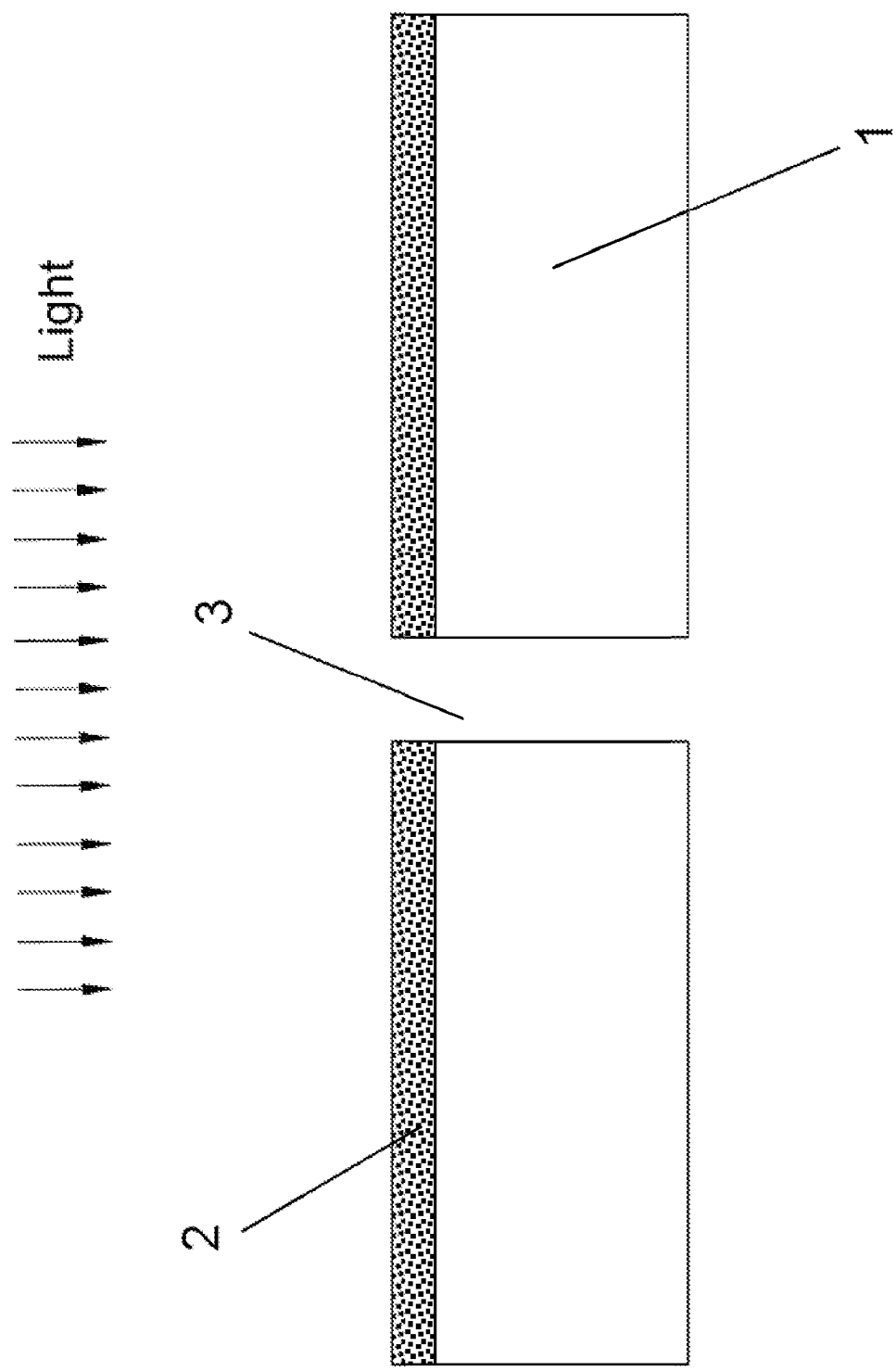

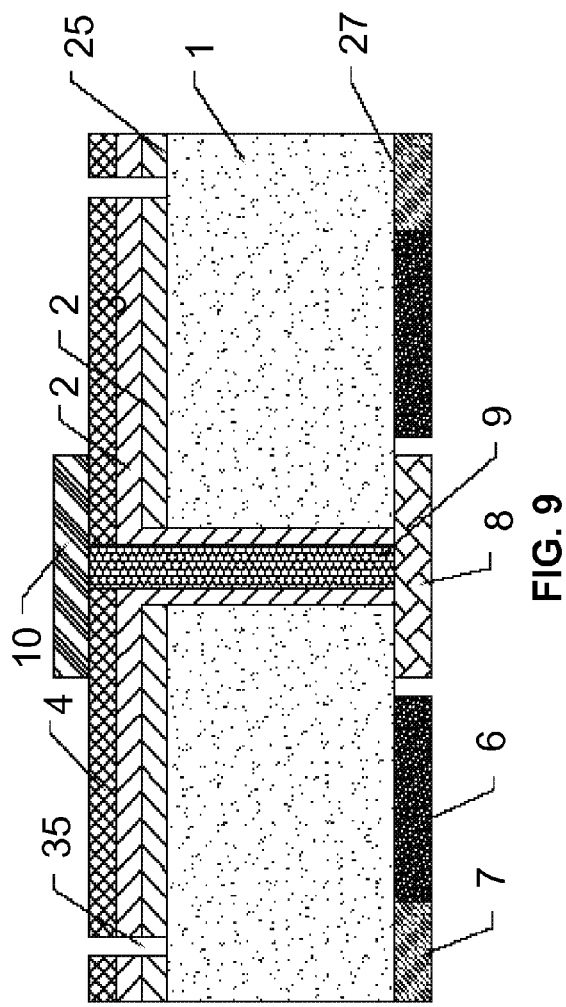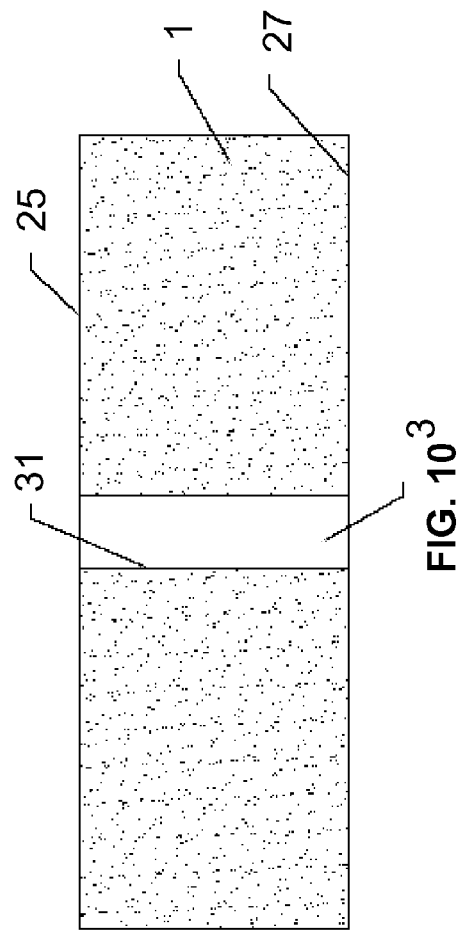

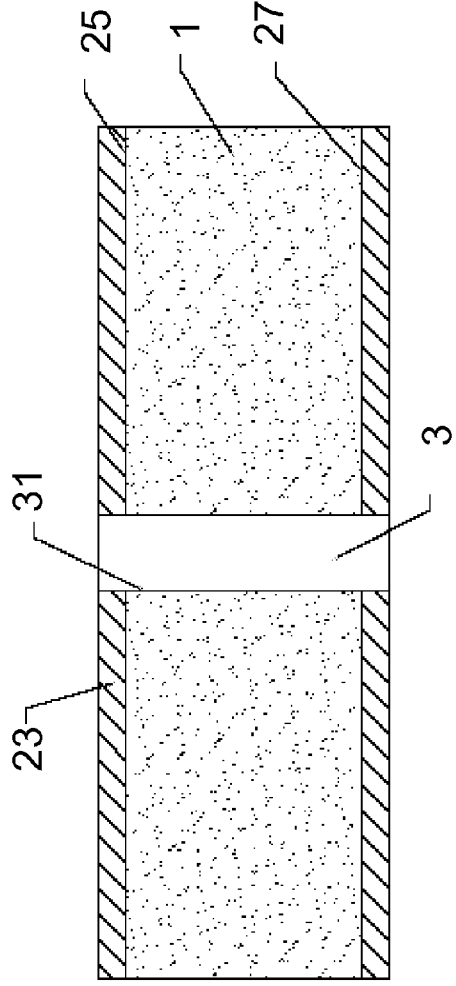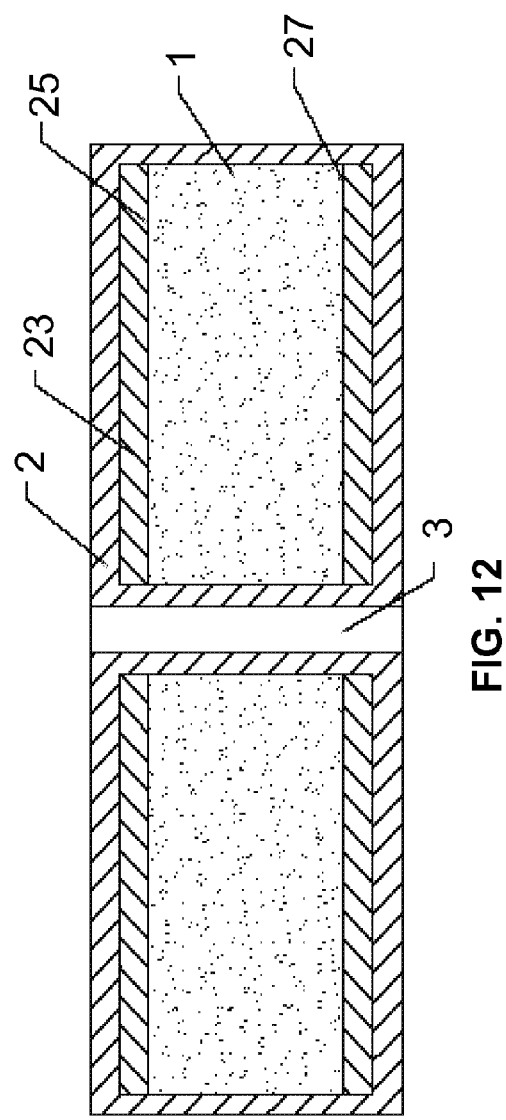

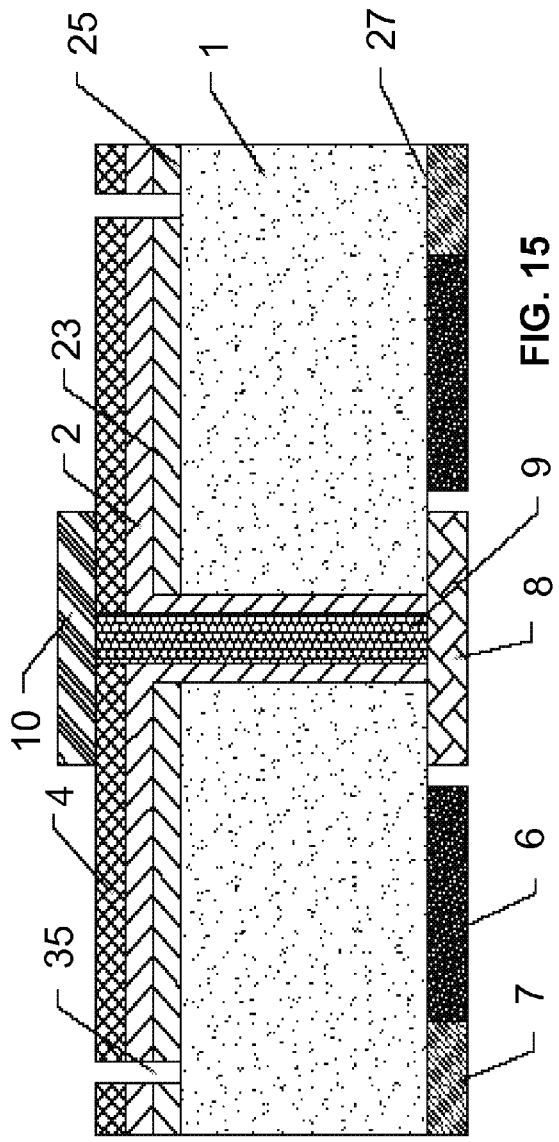
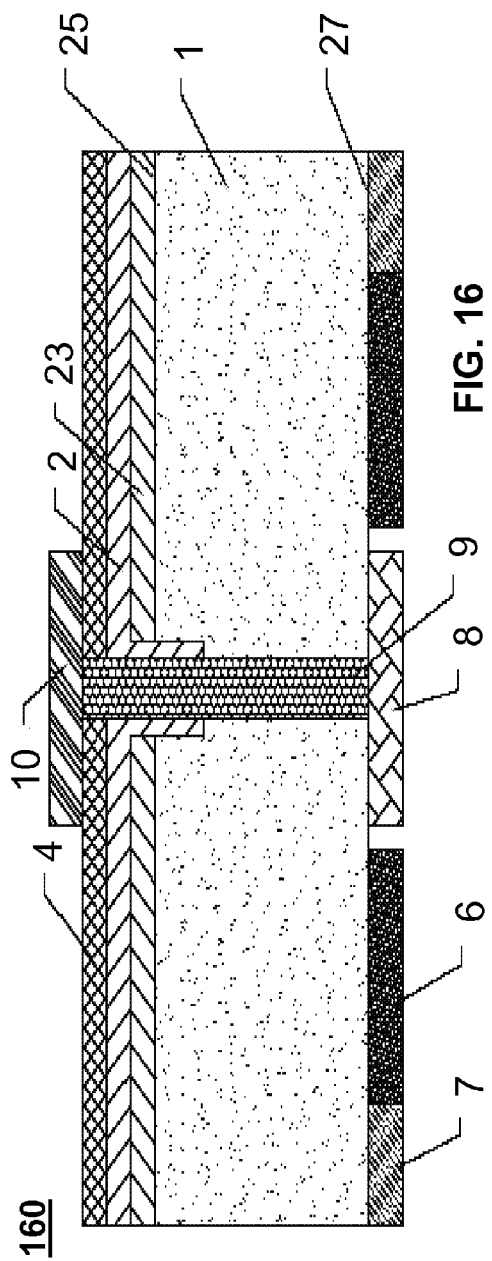

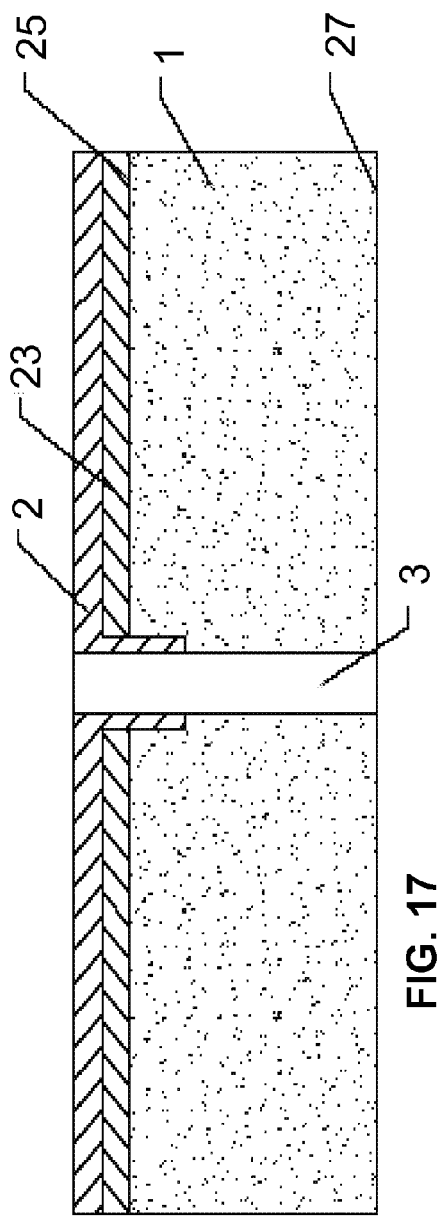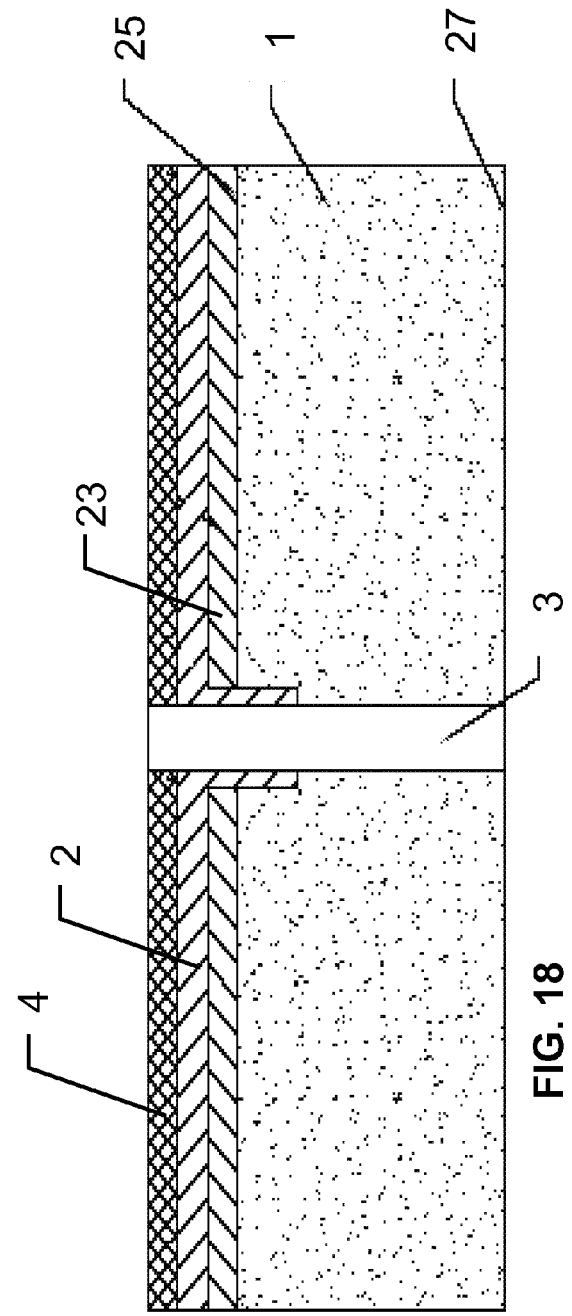

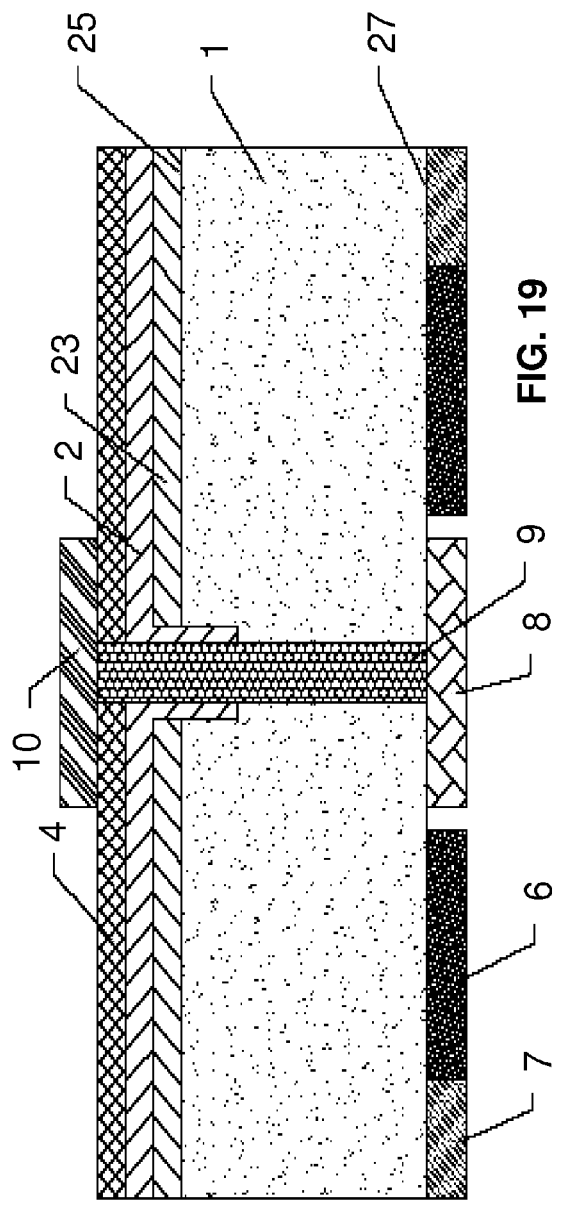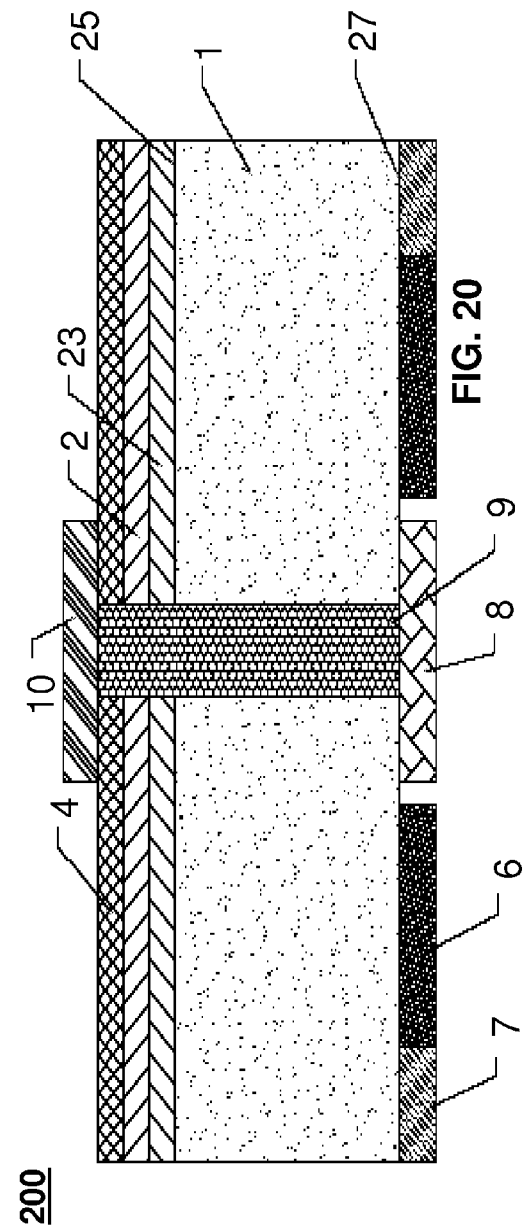

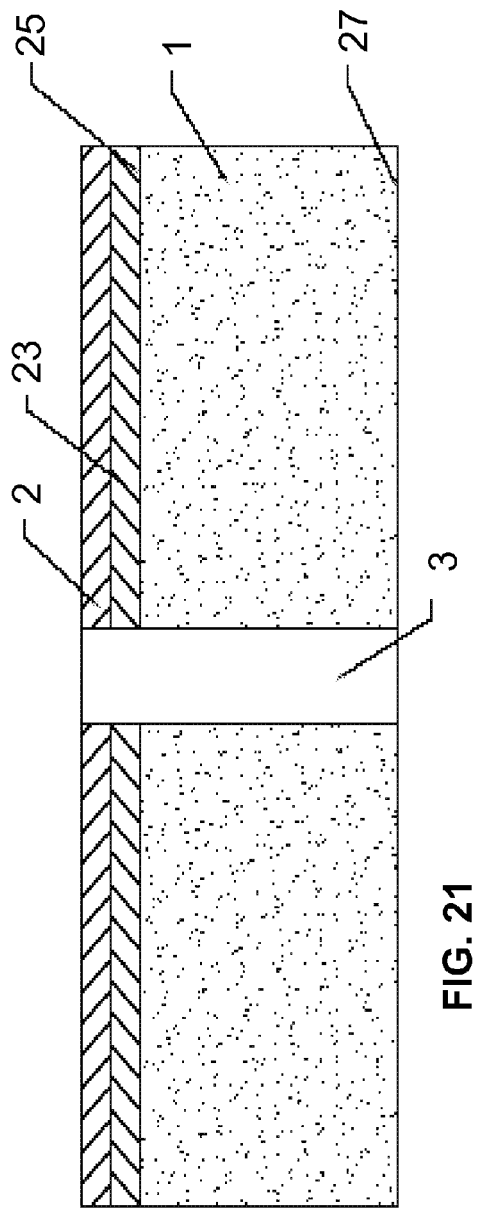
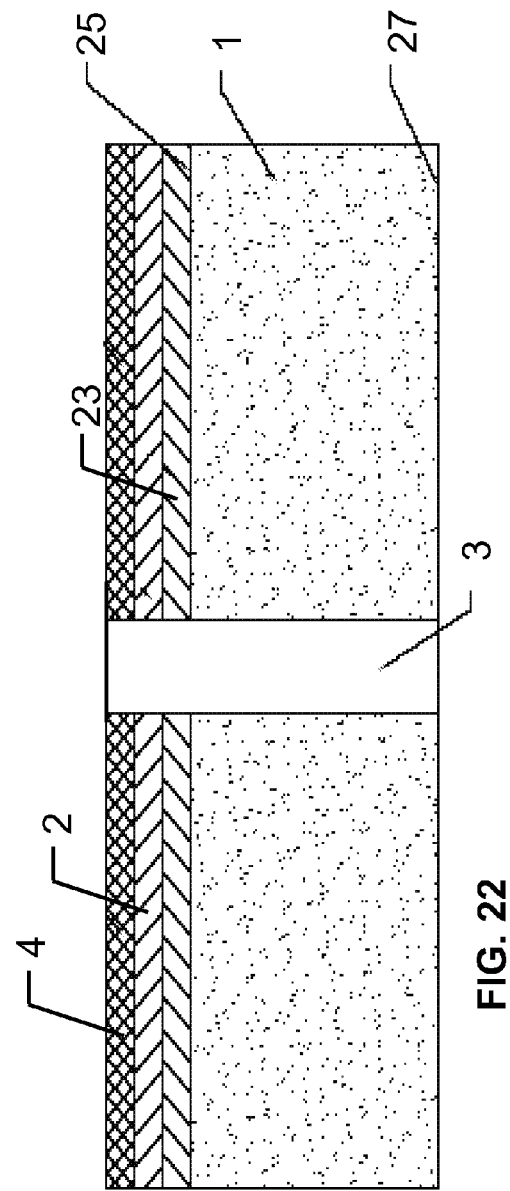

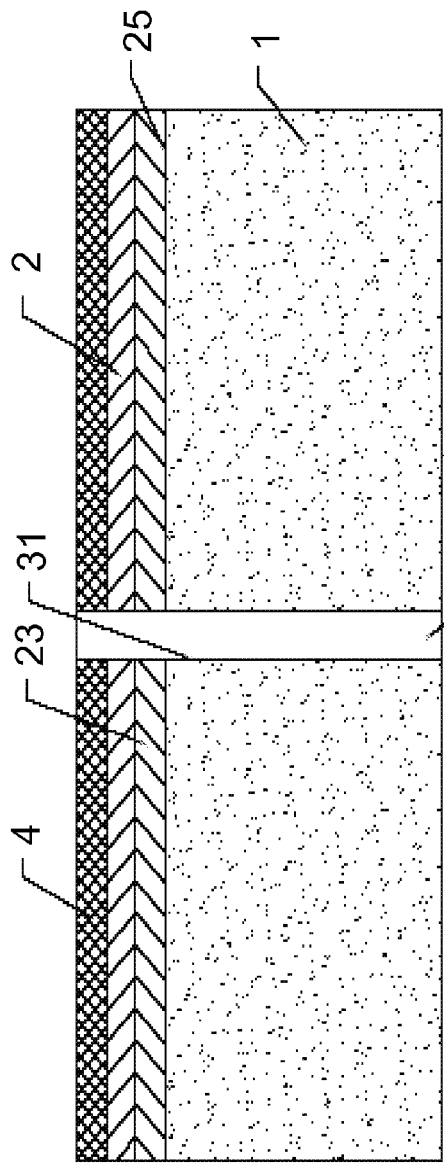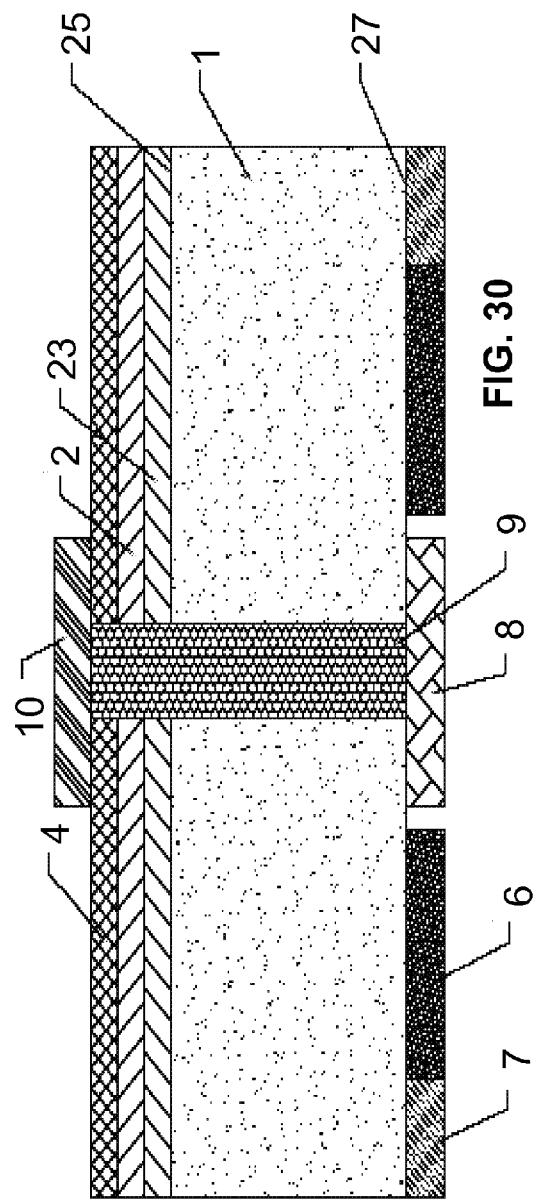

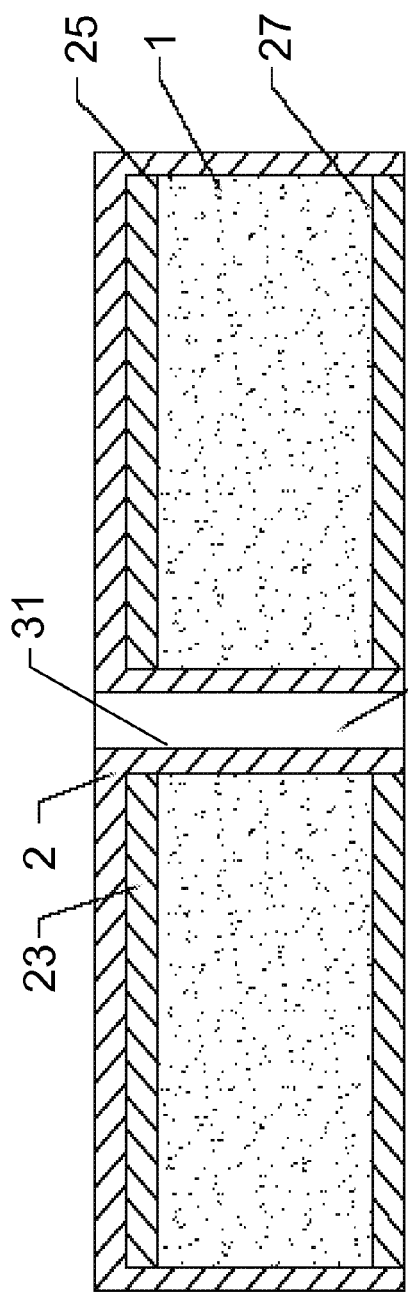
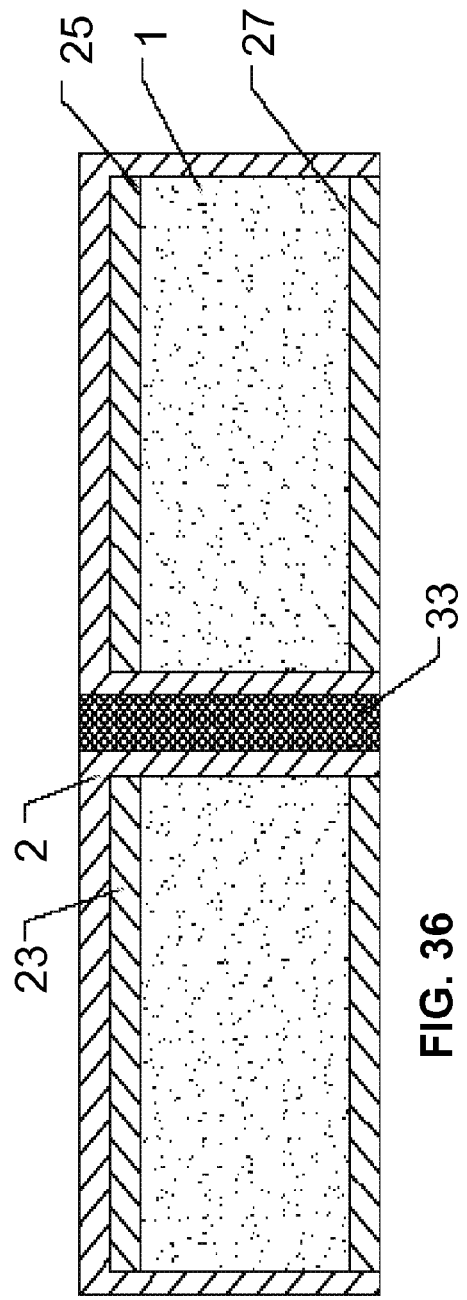
FIG. 35
FIG. 36

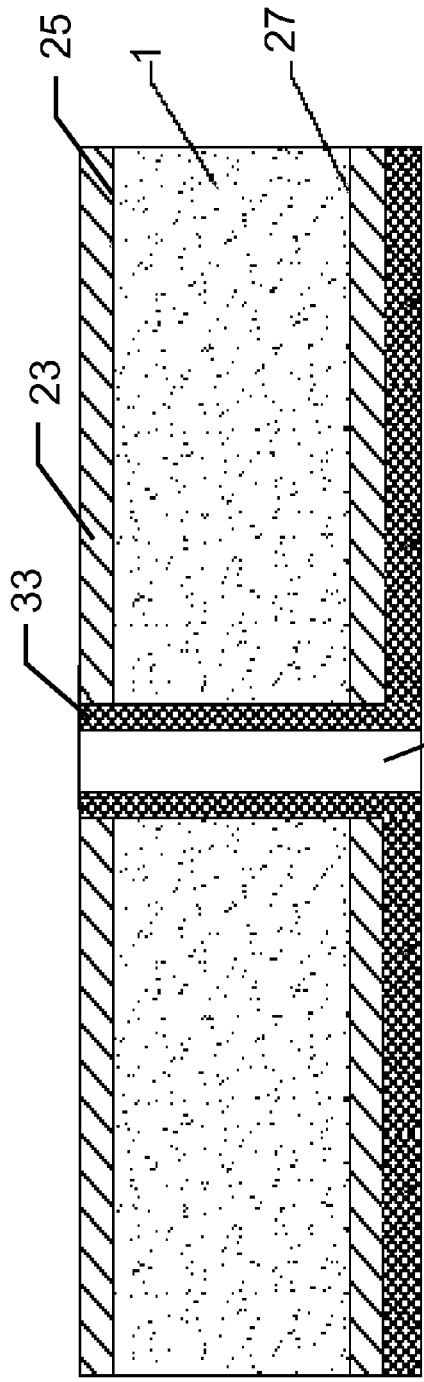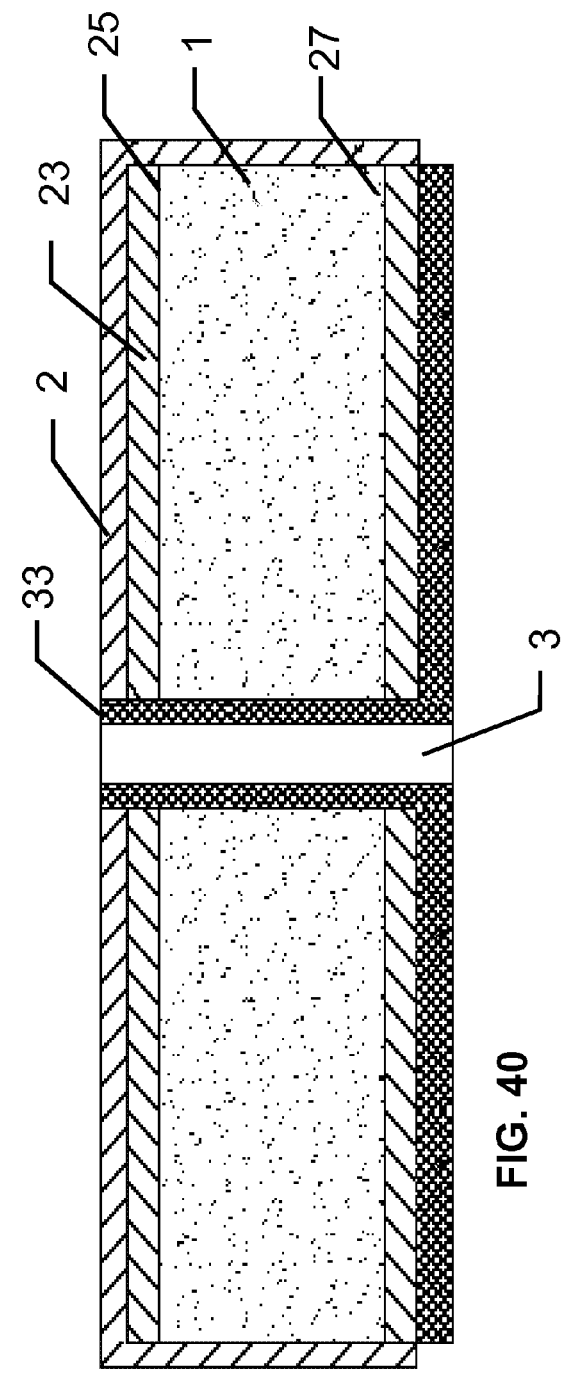

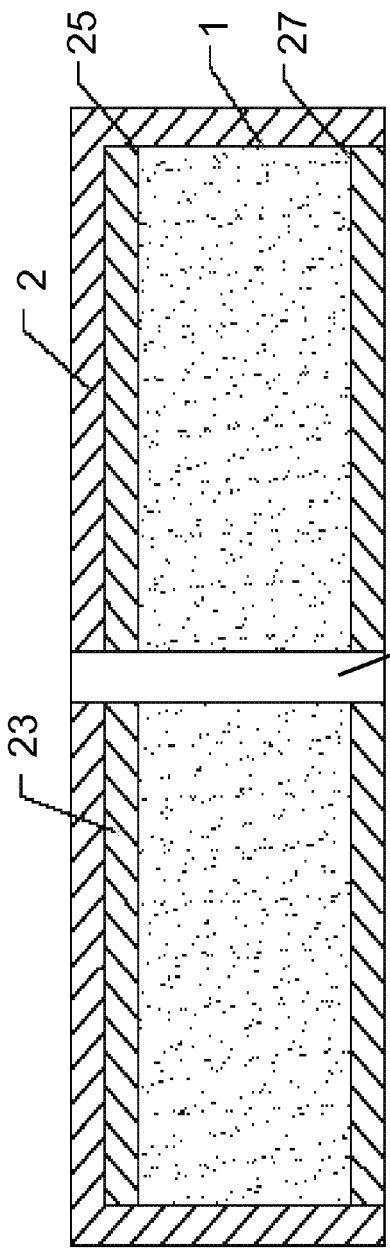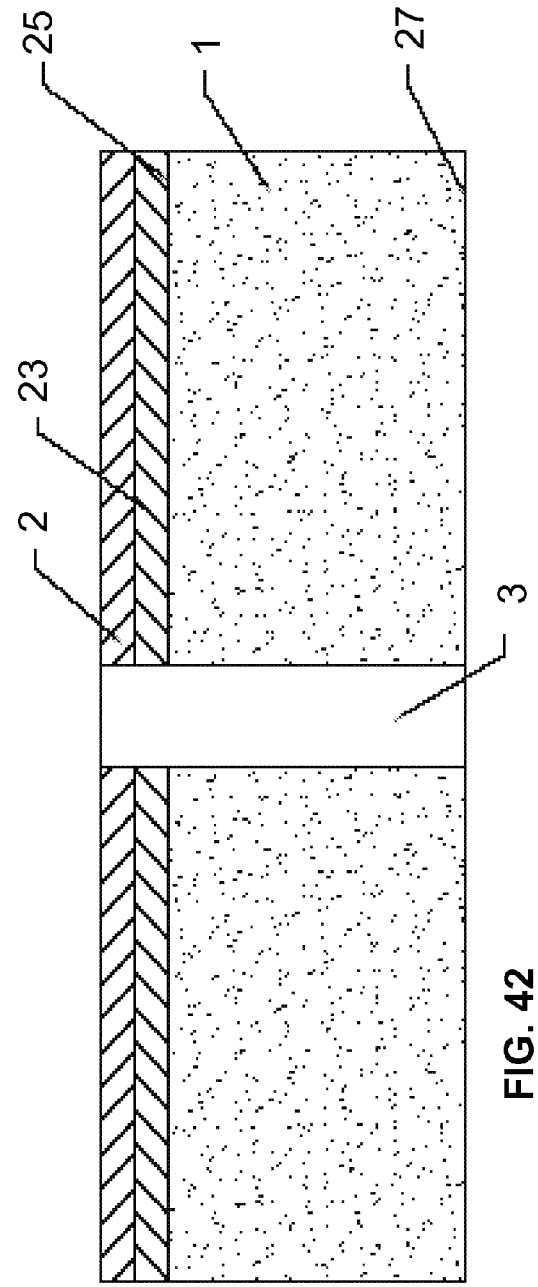

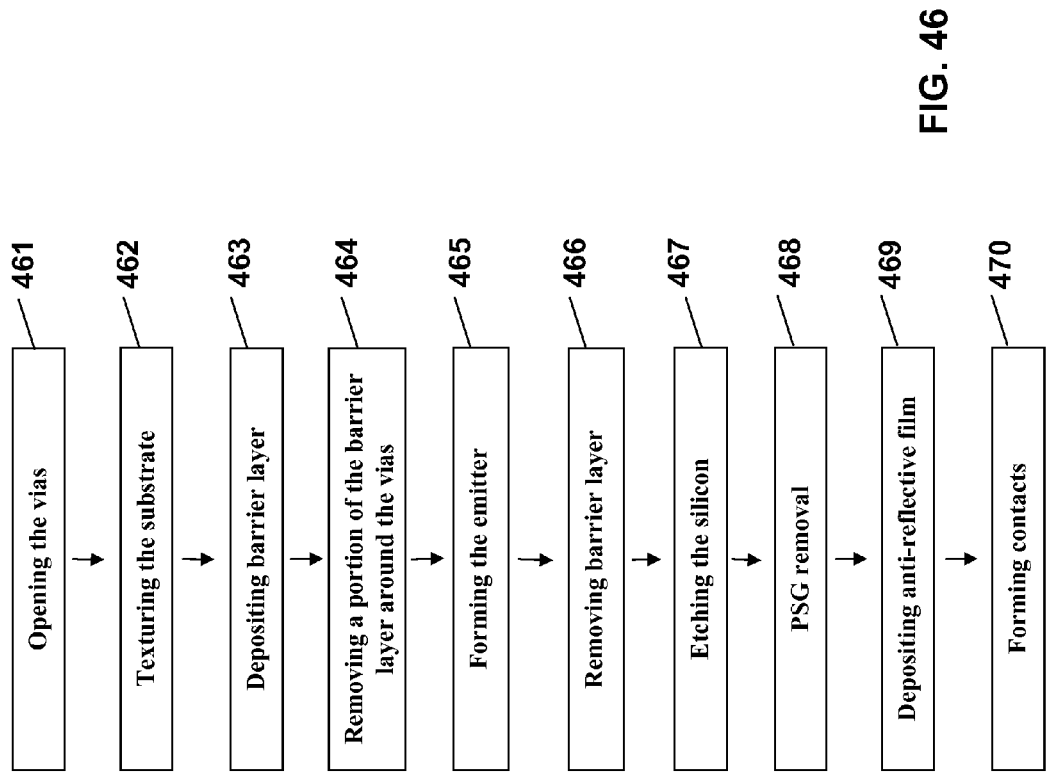

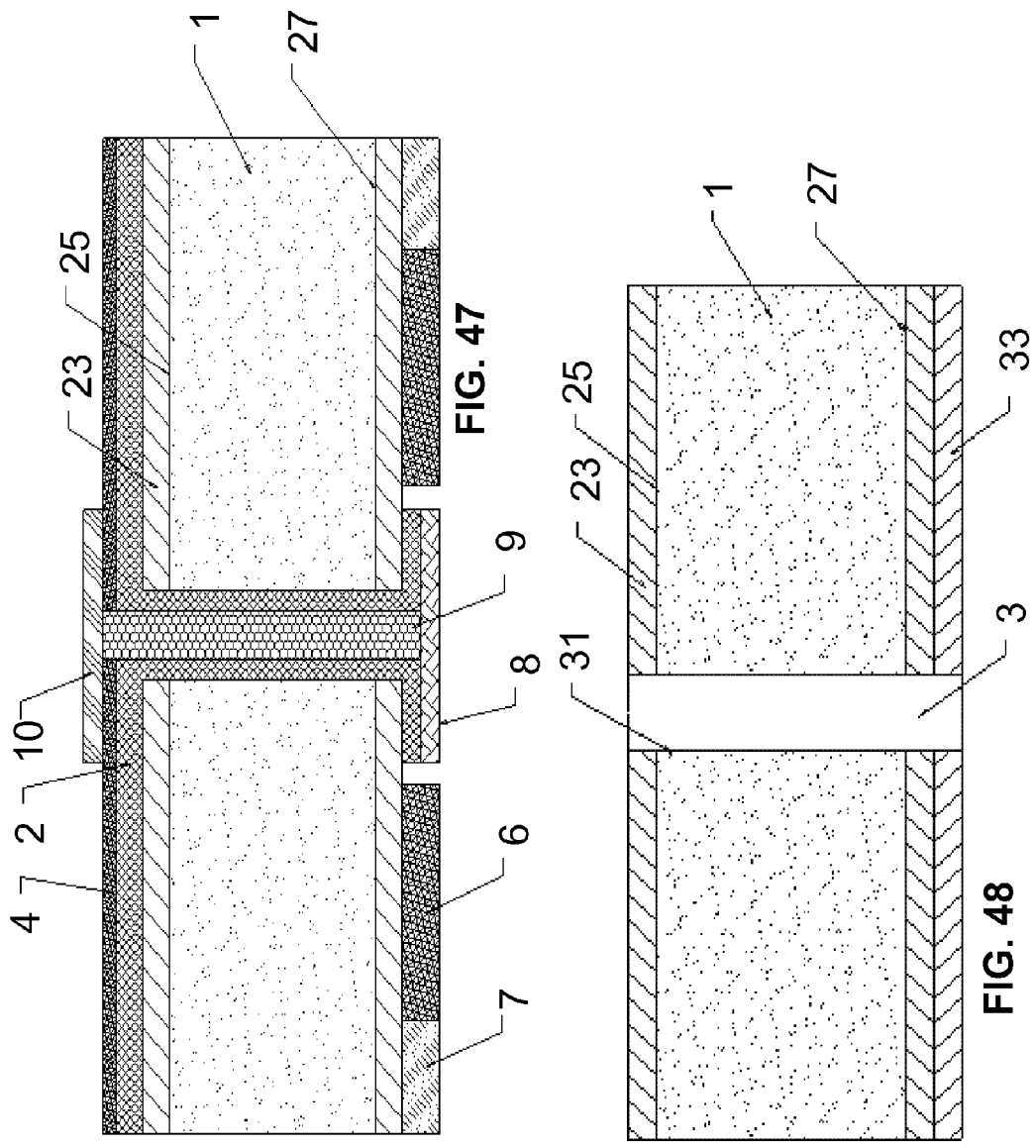

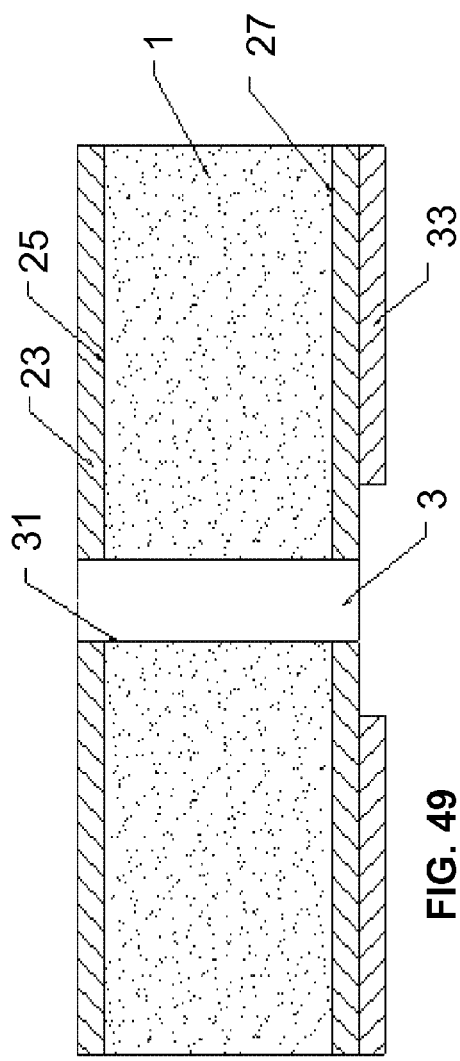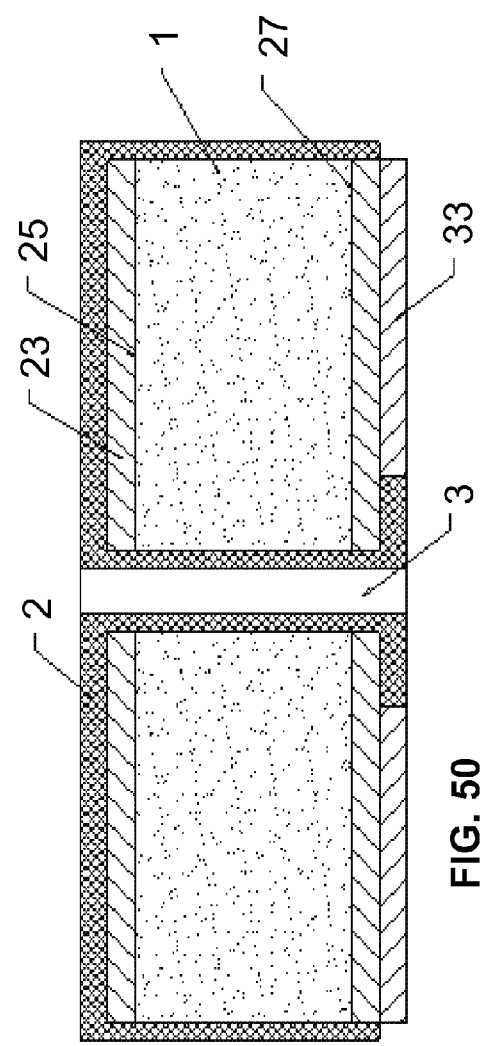

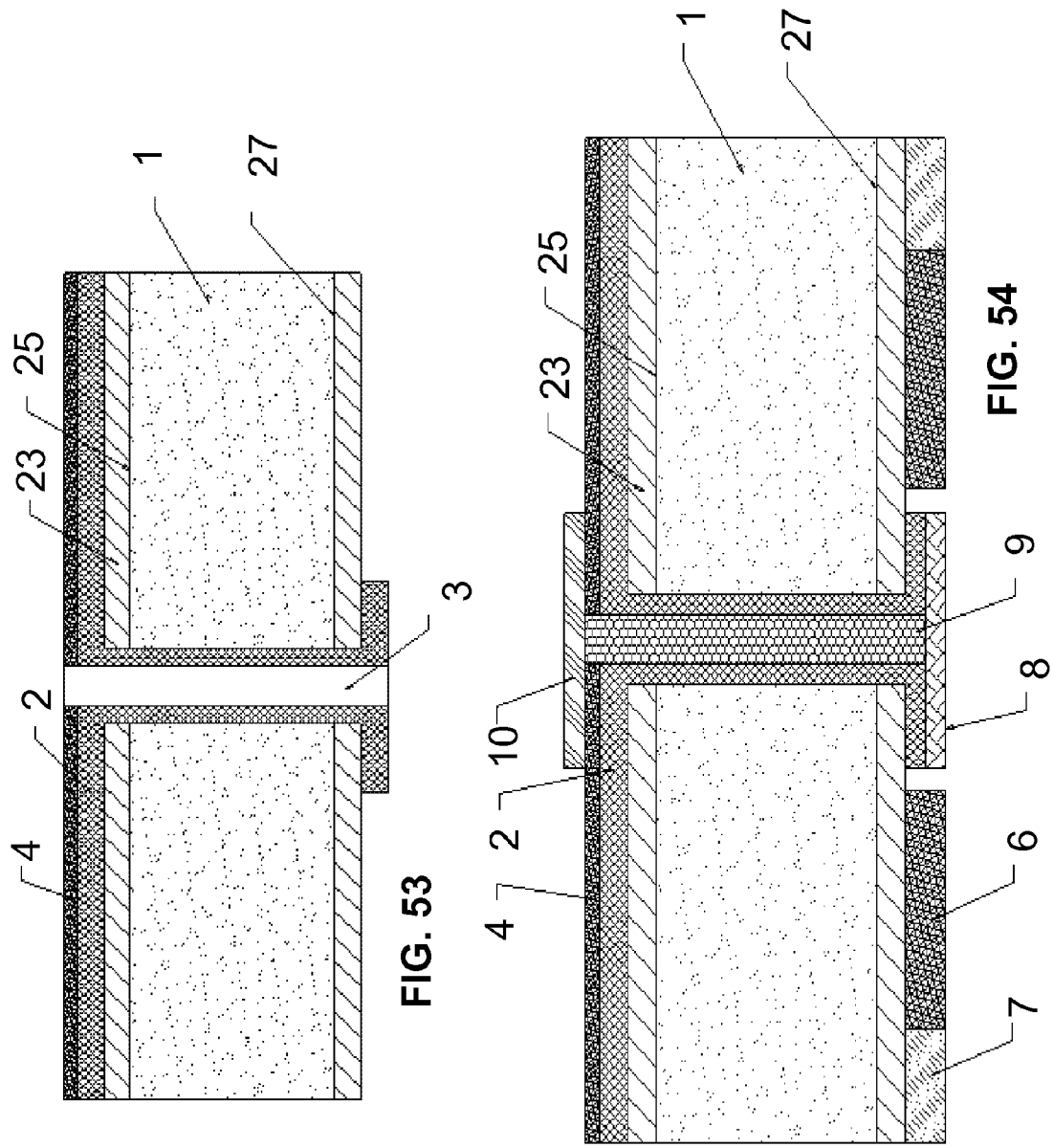

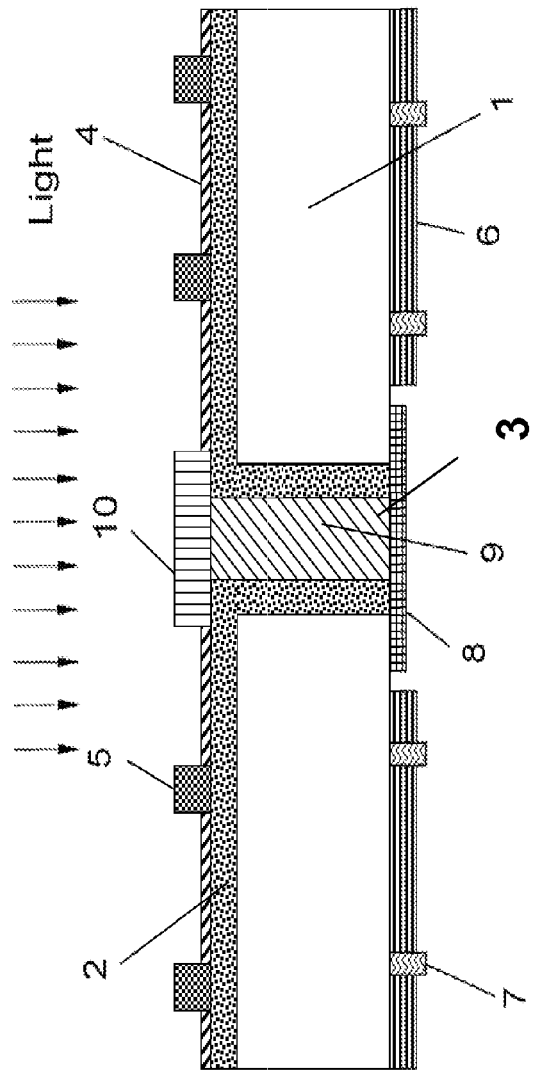
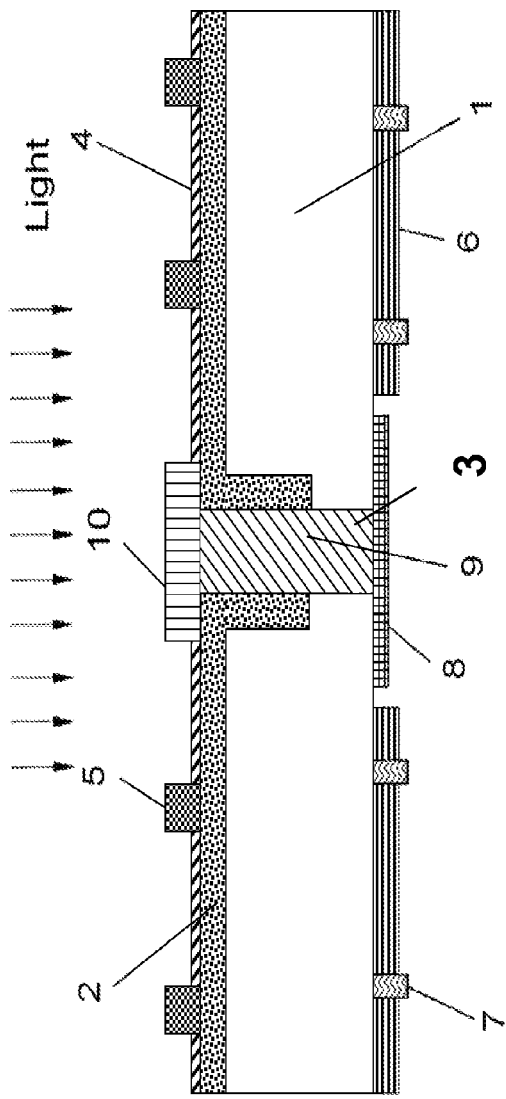
550
FIG. 55
560
FIG. 56

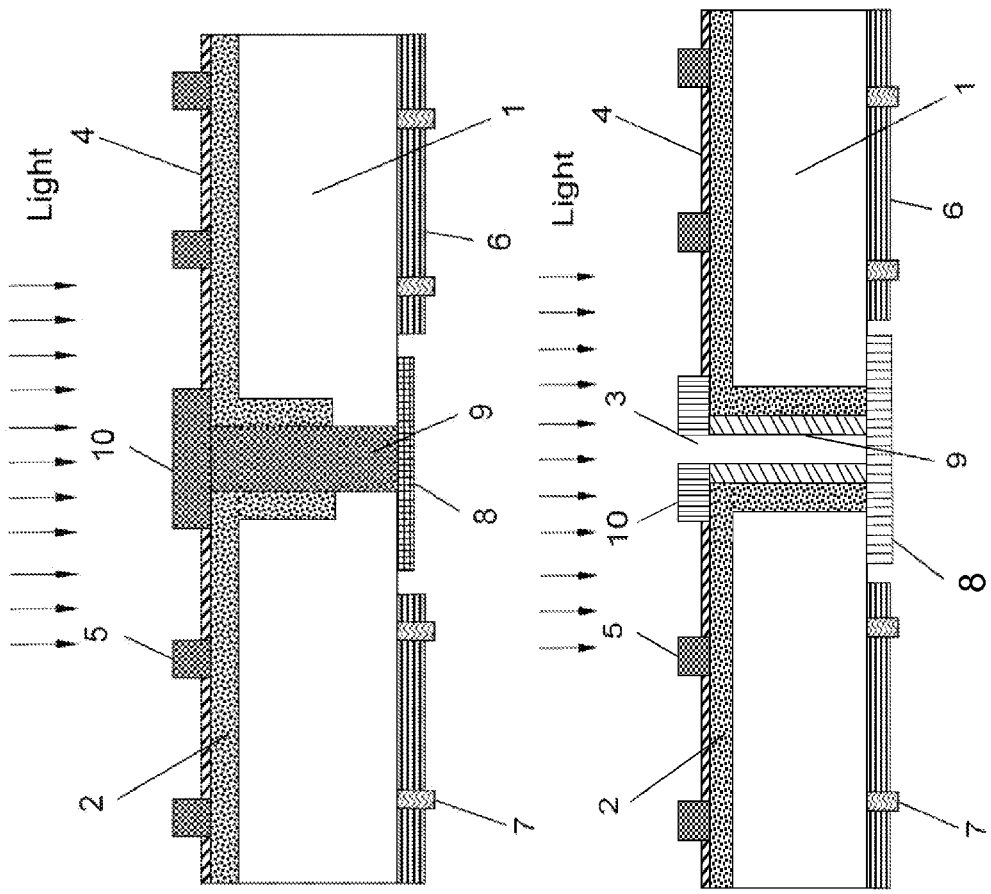

610

620

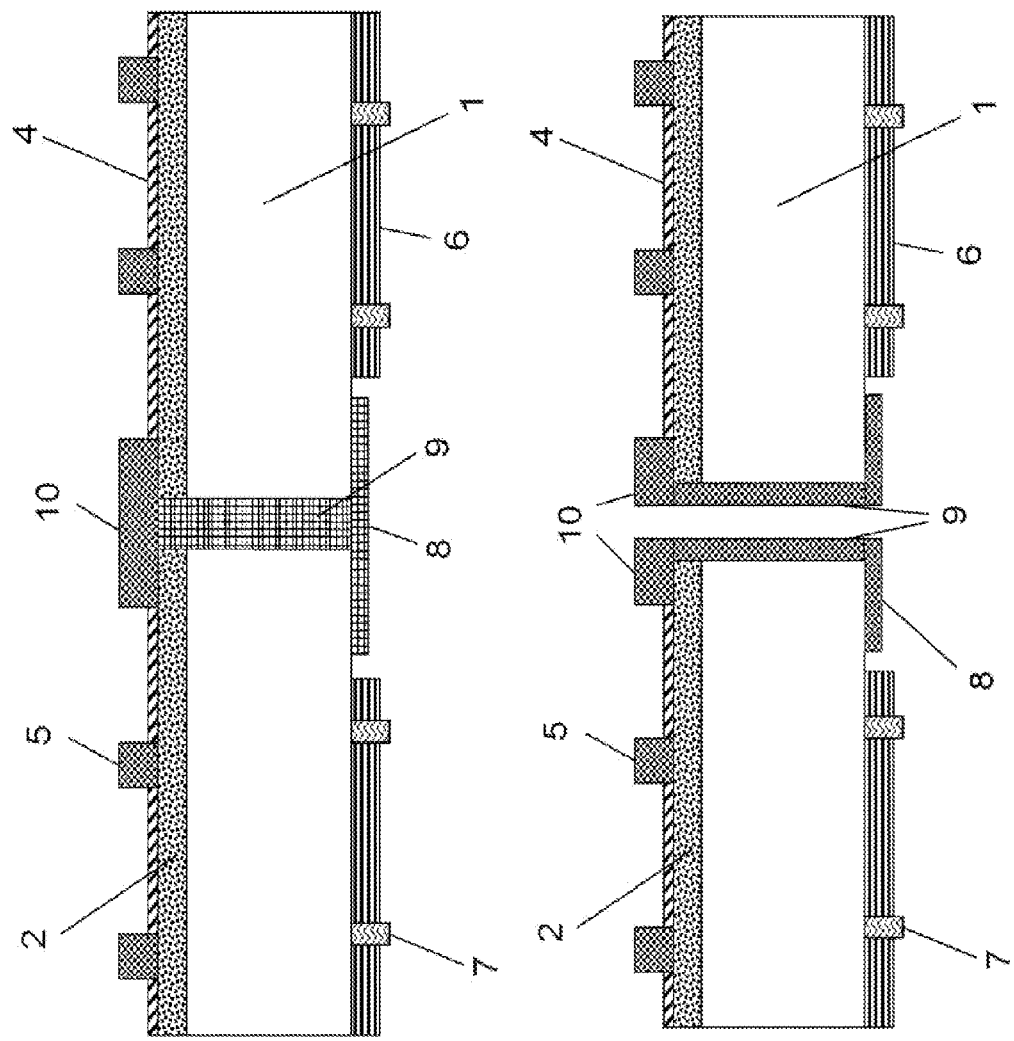

650

660

670

680

METHODS OF MANUFACTURING LIGHT TO CURRENT CONVERTER DEVICES

CROSS-REFERENCE TO RELATED APPLICATIONS

This application claims the benefit of priority to Chinese Patent Application Numbers 201120175836.7, 201120176094.X, 201110141250.3, 201110141621.8, 201110141259.4, 201110141575.1, and 201110141248.6, filed May 27, 2011, which are incorporated by reference herein in their entirety. This application is also related to U.S. patent application Ser. No. 13/193,433 entitled "Light to Current Converter Devices and Methods of Manufacturing the Same", which is incorporated by reference herein in its entirety.

BACKGROUND

1. Field

The present disclosure relates generally to light to current converter devices (e.g., solar cells), and, more particularly, to back contact solar cells.

2. Related Art

In recent years, interest in new forms of renewable energy has increased due to problems associated with conventional energy sources. For example, rising oil prices, global warming, exhaustion of fossil fuel energy, nuclear waste disposal, locating construction sites for new power plants, and the like, have caused interest in photovoltaic devices or solar cells, which are pollution-free energy sources, to grow. As a result, research and development in this field has actively progressed.

A solar cell, which is an apparatus that converts light energy into electrical energy using the photovoltaic effect, may fall into any one of a number of different cell types, such as silicon solar cells, thin film solar cells, dye-sensitized solar cells, and the like. Silicon solar cells occupy the largest portion of current markets due to its high conversion efficiency. In standard-structured solar cells, positive and negative contacts are located on opposite sides of the solar cell. Therefore, shadow loss on the front or illuminated surface by the corresponding contacts limits the light to current conversion efficiency.

Some alternative solar cells have been developed to solve the above problem, one of which is called a "back contact solar cell." In a back contact solar cell, both ohmic contacts (positive and negative contacts) are placed on the back or non-illuminated surface of the solar cell. In this way, shadow loss can be reduced or avoided.

One conventional way to fabricate back contact solar cells is to place the carrier collecting junction formed between oppositely doped semiconductor regions close to the back surface of the cell, rather than the front surface of the cell. This type of back contact solar cell is called a "back junction cell," and is described in "1127.5-Percent Silicon Concentrator Solar Cell" (R. A. Sinton, Y. Kwark, J. Y. Gan, R. M. Swanson, IEEE Electron Device Letters, Vol. ED-7. No. 10, October 1986). However, since the majority of photons are absorbed close to the front surface of the back junction cell, the carriers generated in these regions must diffuse through the entire base region of the cell before reaching the carrier collecting junction located near the back surface. Thus, these types of solar cells require high quality wafers having minority carrier diffusion lengths longer than the wafer thickness as well as very high minority carrier lifetimes.

Another way to fabricate back contact solar cells is to place both external contacts for the oppositely doped regions on the back surface of the solar cell and to place the collecting junction close to the front surface of the solar cell. In these devices, the collection current from the front surface is lead through openings, through-holes, or vias, which extend through the entire wafer to the back surface. Using this structure, shading losses caused by the front metallization may be reduced. The document WO 1998/054763 (EP0985233B1) describes such a structure, referred to herein as "Metal Wrap Through (MWT)." Furthermore, additional patents and patent applications, such as, WO2010126346, JP2010080576, JP2010080578, US20100276772, US20090188550, US20090178707, KR1020100098993, and DE102008033632, describe additions to the MWT structure. However, the described structures generally include a double junction with the emitter located on the front of the cell, back of the cell, and inside walls of the via holes. To illustrate, FIG. 1 shows a cross-sectional view of a P-N junction having an emitter 2 that covers the front surface, the full inner surface of the via hole 3, and the adjacent back side to the via hole of the substrate 1. To generate this type of P-N junction, double sided diffusion is needed, causing throughput loss during manufacturing. Additionally, back contact isolation using a laser is required to eliminate the short circuit that would otherwise occur between the backside emitter and the back contact. The use of the laser increases the breakage ratio of the solar cell, increases the production costs, and causes damage in the crystalline material leading to more recombination of charge carriers in the area around the laser groove.

To omit the back contact isolation step and reduce the excessive shunt, such as that occurring in the via and under the back emitter bus bars, the back side emitter can be removed and a dielectric layer can be positioned to cover the via and the adjacent back side of the solar cell, as disclosed in, for example, patents and patent applications: US20100319766, US20100258177, EP2068369, WO2009071561, CN101889349, US20110005582, US20090084437. Among these, some describe the emitter as being located on only the front surface, while others describe the emitter as being located on both the front surface and inner via holes. In general, these MWT structures involve the additional step of dielectric layer deposition, and other steps to remove the dielectric layer where it is not need. To illustrate, FIG. 2 shows a P-N junction having an emitter 2 that covers the front surface of the substrate 1 and a dielectric layer 12 that covers the full inner surface of the via hole 3. Additionally, FIG. 3 shows a P-N junction having an emitter 2 that covers the front and full inner surface of the substrate 1 and a dielectric layer 12 covering the full inner surface of the via hole 3.

Thus, efficient light to current converter devices and processes for making the same are desired.

BRIEF SUMMARY

Processes for making light to current converter devices are provided. In one embodiment, the process may include generating a via hole through a semiconductor substrate of a first conductive type, the via hole extending from a front surface of the semiconductor substrate to a rear surface of the semiconductor substrate. The process may further include forming a textured front surface on the front surface of the semiconductor substrate, forming a textured rear surface on the rear surface of the semiconductor substrate, forming a semiconductor layer of a second conductive type on at least the textured front surface, the textured rear surface, and an inner surface of the via hole, wherein the second conductive type is opposite the first conductive type, and etching the semiconductor layer of the second conductive type, wherein etching the semiconductor layer of the second conductive type includes removing the semiconductor layer of the second conductive type formed on the textured rear surface.

In some embodiments, etching the semiconductor layer of the second conductive type may further include removing at least a portion of the semiconductor layer of the second conductive type formed on the inner surface of the via hole. In other embodiments, etching the semiconductor layer of the second conductive type may further include removing all of the semiconductor layer of the second conductive type formed on the inner surface of the via hole.

In another embodiment, the process may include forming a textured front surface on the front surface of the semiconductor substrate and forming a semiconductor layer of a second conductive type on at least the textured front surface, wherein the second conductive type is opposite the first conductive type. The process may further include generating a via hole through the semiconductor substrate and semiconductor layer of the second conductive type and etching the semiconductor layer of the second conductive type, wherein after etching the semiconductor layer of the second conductive type, the semiconductor layer of the second conductive type is located on only the textured front surface.

In yet another embodiment, the process may include generating a via hole through a semiconductor substrate of a first conductive type, the via hole extending from a front surface of the semiconductor substrate to a rear surface of the semiconductor substrate. The process may further include forming a textured front surface on the front surface of the semiconductor substrate and forming a semiconductor layer of a second conductive type on at least the textured front surface and an inner surface of the via hole, wherein the second conductive type is opposite the first conductive type. The process may further include depositing a barrier layer on the semiconductor layer of the second conductive type formed on the inner surface of the via hole, etching the semiconductor layer of the second conductive type, wherein the barrier layer prevents etching of the semiconductor layer of the second conductive type that is covered by the barrier layer, and wherein after etching the semiconductor layer of the second conductive type, the semiconductor layer of the second conductive type is located on only the textured front surface and the inner surface of the via hole, and removing the barrier layer.

In some embodiments, the process may further include forming a textured rear surface on the rear surface of the semiconductor substrate and forming the semiconductor layer of the second conductive type on the textured rear surface of the semiconductor substrate.

In yet another embodiment, the process may include generating a via hole through a semiconductor substrate of a first conductive type, the via hole extending from a front surface of the semiconductor substrate to a rear surface of the semiconductor substrate. The process may further include forming a textured front surface on the front surface of the semiconductor substrate, forming a textured rear surface on the rear surface of the semiconductor substrate, depositing a barrier layer on the textured rear surface and an inner surface of the via hole, and forming a semiconductor layer of a second conductive type on the semiconductor substrate, wherein the barrier layer prevents formation of the semiconductor layer of the second conductive type on portions of the textured rear surface and the inner surface of the via hole that are covered by the barrier layer, and wherein the second conductive type is opposite the first conductive type. The process may further include removing the barrier layer and etching the semiconductor layer of the second conductive type, wherein after etching the semiconductor layer of the second conductive type, the semiconductor layer of the second conductive type is located on only the textured front surface.

In some embodiments, the barrier layer may be deposited on the textured rear surface such that the barrier layer extends between 0.1 mm to 10 cm from an edge of the via hole. In other embodiments, the barrier layer may be deposited on all of the textured rear surface. In some embodiments, the barrier layer may be deposited on a full inner surface of the via hole.

In yet another embodiment, the process may include generating a via hole through a semiconductor substrate of a first conductive type, the via hole extending from a front surface of the semiconductor substrate to a rear surface of the semiconductor substrate. The process may further include forming a textured front surface on the front surface of the semiconductor substrate, forming a textured rear surface on the rear surface of the semiconductor substrate, depositing a barrier layer on the textured rear surface, removing a portion of the barrier layer around the via hole, and forming a semiconductor layer of a second conductive type on the semiconductor substrate, wherein the barrier layer prevents formation of the semiconductor layer of the second conductive type on portions of the textured rear surface that are covered by the barrier layer, wherein the second conductive type is opposite the first conductive type. The process may further include removing the barrier layer and etching the semiconductor layer of the second conductive type formed on side surfaces of the semiconductor substrate.

In some embodiments, removing a portion of the barrier layer around the via hole may include removing the barrier layer formed within a threshold distance from an edge of the via hole, wherein the threshold distance is between 0.1 mm and 10 cm. In some embodiments, removing a portion of the barrier layer around the via hole may be performed with a chemical erosion paste, wherein the chemical erosion paste is washed away with a lye solvent or ion solvent. In some embodiments, the chemical erosion paste may include ammonium bifluoride or phosphoric acid.

In some examples, the barrier layer described in the embodiments above may be deposited using a printing paste, plasma-enhanced chemical vapor deposition, chemical oxidating, rapid thermal processing, magnetron sputtering, or vacuum evaporating. In some examples, the barrier layer described in the embodiments above may include a polymer resin, silicon resin, silicon oxide, silicon nitride, titanium oxide, or zinc oxide.

In some examples, the barrier layer described in the embodiments above may be removed by washing the barrier layer with lye having a temperature between 20-90° C. and a concentration between 0.05%-10%.

In some examples of the embodiments described above, the processes may further include forming a front electrode operable to collect current from the front surface, the front electrode being electrically coupled to the semiconductor layer of the second conductive type, forming a through-hole electrode disposed at least partially within the via hole and coupled to the front electrode, forming a back electrode electrically coupled to the rear surface of the semiconductor substrate, the back electrode being isolated from the through-hole electrode, and forming an impurity layer on the rear surface of the semiconductor substrate.

In some examples of the embodiments described above, the through-hole electrode may include an inner via hole electrode disposed within the via hole, a via front collector covering at least a portion of a front side of the via hole, the via front collector being coupled to the front electrode and the inner via hole electrode, and a via rear collector covering at least a portion of a rear side of the via hole, the via rear collector being coupled to the inner via hole electrode.

In some examples of the embodiments described above, forming the through-hole electrode may include printing the via front collector on the front surface of the semiconductor substrate, printing the inner via hole electrode into the via hole, printing the via rear collector on the rear surface of the semiconductor substrate, and co-firing the printed via front collector, inner via hole electrode, and via rear collector.

In some examples of the embodiments described above, the processes may further include etching a front side edge of the semiconductor layer of the second conductive type formed on the textured front surface In some examples of the embodiments described above, the processes may further include removing impurities from the semiconductor substrate after the etching the semiconductor layer of the second conductive type and depositing a film on the front surface of the semiconductor substrate. In some embodiments, the film may include an anti-reflective film.

In some examples of the embodiments described above, generating the via hole through a semiconductor substrate may be performed using a laser. In some examples of the embodiments described above, etching the semiconductor layer of the second conductive type may be performed using a chemical solvent, chemical erosion paste, or plasma gas. In some examples of the embodiments described above, etching using the chemical solvent may be performed by infiltrating the semiconductor layer of the second conductive type with the chemical solvent. In some examples of the embodiments described above, etching using the chemical erosion paste may be performed by printing the chemical erosion paste onto the semiconductor layer of the second conductive type. In some examples of the embodiments described above, etching using the plasma gas may be performed by contacting the semiconductor layer of the second conductive type with the plasma gas.

In some examples of the embodiments described above, the first conductive type may be N-type and the second conductive type may be P-type. In other examples of the embodiments described above, the first conductive type may be P-type and the second conductive type may be N-type.

In some examples of the embodiments described above, forming the textured front surface on the front surface of the semiconductor substrate may include etching the front surface of the semiconductor substrate, and forming the textured rear surface on the rear surface of the semiconductor substrate may include etching the rear surface of the semiconductor substrate.

In some examples of the embodiments described above, etching the semiconductor layer of the second conductive type may further include removing the semiconductor layer of the second conductive type formed on a side surface of the semiconductor substrate. In some examples of the embodiments described above, the processes may further include etching the semiconductor layer of the second conductive type formed on the textured rear surface and the semiconductor layer of the second conductive type formed on the side surface at the same time.

BRIEF DESCRIPTION OF THE DRAWINGS

FIGS. 1-3 show cross-sectional views of exemplary P-N junctions.

FIGS. 4-7 show cross-sectional views of exemplary P-N junctions according to various embodiments.

FIG. 9 shows a cross-sectional view of an exemplary light to current converter device that can be made using the exemplary process shown in FIG. 8.

FIGS. 10-15 show the exemplary device of FIG. 9 at various stages of manufacture using the exemplary process shown in FIG. 8.

FIG. 16 shows a cross-sectional view of an exemplary light to current converter device that can be made using the exemplary process shown in FIG. 8.

FIGS. 17-19 show the exemplary device of FIG. 16 at various stages of manufacture using the exemplary process shown in FIG. 8.

FIG. 20 shows a cross-sectional view of an exemplary light to current converter device that can be made using the exemplary process shown in FIG. 8.

FIGS. 21-23 show the exemplary device of FIG. 20 at various stages of manufacture using the exemplary process shown in FIG. 8.

FIGS. 25-30 show the exemplary device of FIG. 20 at various stages of manufacture using the exemplary process shown in FIG. 24.

FIGS. 35-37 show the exemplary device of FIG. 9 at various stages of manufacture using the exemplary process shown in FIG. 34.

FIGS. 39-42 show the exemplary device of FIG. 20 at various stages of manufacture using the exemplary process shown in FIG. 38.

FIG. 46 shows an exemplary process for making an exemplary light to current converter device.

FIG. 47 shows a cross-sectional view of an exemplary light to current converter device that can be made using the exemplary process shown in FIG. 46.

FIGS. 48-54 show the exemplary device of FIG. 47 at various stages of manufacture using the exemplary process shown in FIG. 46.

FIGS. 55-68 show schematic cross-sectional views of light to current converter devices according to various embodiments.

DETAILED DESCRIPTION

Figure 8:
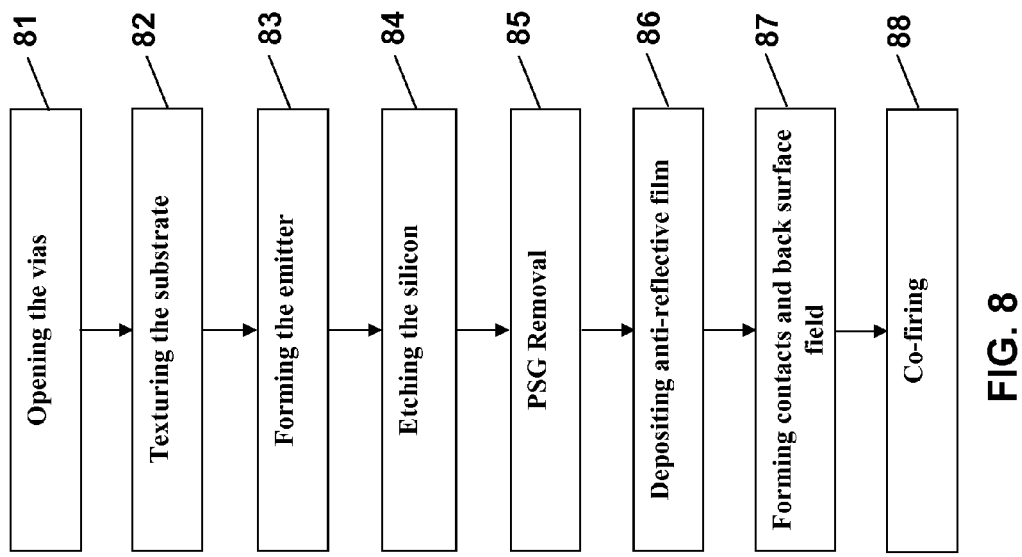
FIG. 8 shows an exemplary process for making an exemplary light to current converter device.

The following description is presented to enable a person of ordinary skill in the art to make and use the various embodiments. Descriptions of specific devices, techniques, and applications are provided only as examples. Various modifications to the examples described herein will be readily apparent to those of ordinary skill in the art, and the general principles defined herein may be applied to other examples and applications without departing from the spirit and scope of the various embodiments. Thus, the various embodiments are not intended to be limited to the examples described herein and shown, but are to be accorded the scope consistent with the claims.

As used herein and in the appended claims, the singular forms "a," "an," and "the" include plural reference unless the context clearly indicates otherwise. Additionally, the terms "comprises" and "comprising" should be interpreted as referring to elements, components, or steps in a non-exclusive manner, indicating that the referenced elements, components, or steps may be present, or utilized, alone or in combination with other elements, components, or steps that are not expressly referenced.

Various embodiments are described below relating to processes for making light to current converter devices, such as solar cells. The processes can be used to make light to current converter devices having P-N junctions located on only the top surface of the cell, located on the top surface and symmetrically along a portion of the inner surface of the via holes, located on the top surface and asymmetrically along a portion of the inner surface of the via holes, located on the top surface and full inner surface of the via holes, or located on the top surface, full inner surface of the via holes, and a portion of the bottom surface of the cell. The processes may isolate the desired P-N junction by etching the emitter, forming a via hole after forming the emitter, using a barrier layer to protect portions of the emitter from etching, or using a barrier layer to prevent the emitter from being formed on portions of the substrate. Light to current converter devices that can be made using the processes are also provided.

FIGS. 4-7 illustrate exemplary P-N junctions that may be used in a light to current converter device, such as a solar cell. Unlike the P-N junctions shown in FIGS. 1-3, the exemplary P-N junctions shown in FIGS. 4-7 do not include a deposited dielectric layer or an emitter located on the back surface of the substrate. The absence of a back side emitter allows a device having a P-N junction like that shown in FIGS. 4-7 to be manufactured without performing double side diffusion or back contact isolation. Additionally, the absence of a deposited dielectric layer allows the device to be manufactured without performing dielectric layer deposition and removal as is required to manufacture the P-N junctions shown in FIGS. 2-3. As a result, a device having a P-N junction similar or identical to those shown in FIGS. 4-7 may be cheaper and quicker to manufacture than those having a P-N junction similar to those shown in FIGS. 1-3.

Specifically, FIG. 4 illustrates an exemplary P-N junction having an emitter 2 that covers the front surface of the substrate 1 and the full inner surface of the via hole 3. The substrate 1 may include monocrystalline silicon or polycrystalline silicon having a first doping type (e.g., P or N) while the emitter 2 may have an opposite doping type (e.g., N or P). In this example, since the emitter 2 may not cover the backside of substrate 1, the backside of substrate 1 may remain the same doping type as substrate 1. In other examples, other types of opposite conductivity type semiconductors may be used for substrate 1 and emitter 2.

FIG. 5 illustrates another exemplary P-N junction having an emitter 2 that covers the front surface of the substrate 1 and symmetrically covers a portion of the inner surface of the via hole 3. The substrate 1 may include monocrystalline silicon or polycrystalline silicon having a first doping type (e.g., P or N) while the emitter 2 may have an opposite doping type (e.g., N or P). In this example, since the emitter 2 may not cover a portion of the inner surface of via hole 3 and the backside of substrate 1, the uncovered portion of the inner surface of via hole 3 and the backside of substrate 1 may remain the same doping type as substrate 1.

FIG. 6 illustrates yet another exemplary P-N junction having an emitter 2 that covers the front surface of the substrate 1 and asymmetrically covers a portion of the inner surface of the via hole 3. The substrate 1 may include monocrystalline silicon or polycrystalline silicon having a first doping type (e.g., P or N) while the emitter 2 may have an opposite doping type (e.g., N or P). In this example, since the emitter 2 may not cover a portion of the inner surface of via hole 3 and the backside of substrate 1, the uncovered portion of the inner surface of via hole 3 and the backside of substrate 1 may remain the same doping type as substrate 1.

FIG. 7 illustrates yet another exemplary P-N junction having an emitter 2 that covers only the front surface of the substrate 1. The substrate 1 may include monocrystalline silicon or polycrystalline silicon having a first doping type (e.g., P or N) while the emitter 2 may have an opposite doping type (e.g., N or P). In this example, since the emitter 2 may not cover the inner surface of via hole 3 and the backside of substrate 1, the inner surface of via hole 3 and the backside of substrate 1 may remain the same doping type as substrate 1.

Exemplary processes for manufacturing light to current converter devices having exemplary P-N junctions similar or identical to those shown in FIGS. 1 and 4-7 are described below with respect to FIGS. 8-54.

FIG. 8 illustrates an exemplary process 80 that may be used to make light to current converter devices, such as those described above. In particular, exemplary process 80 may be used to manufacture devices having P-N junctions similar or identical to those shown in FIGS. 4-7. Various embodiments of process 80 are described below with reference to figures showing exemplary light to current converter devices at various stages of manufacture.

In the first example, process 80 may be used to make exemplary light to current converter device 90 (and devices similar to light to current converter device 90), as shown in FIG. 9. Device 90 includes a P-N junction similar to that shown in FIG. 4.

At block 81 of process 80, and as shown in FIG. 10, vias may be opened into a semiconductor substrate. Specifically, a via hole 3 having an inner hole wall 31 may be formed in a P-type or N-type semiconductor substrate 1. In some examples, the semiconductor substrate 1 may have a resistance between 0.5-3 Ω-cm. The via hole 3 may be formed by applying a laser having a wavelength of 1064 nm, 1030 nm, 532 nm, 355 nm, or other appropriate wavelength to the semiconductor substrate. However, it should be appreciated that other known processes may be used to form via hole 3, such as mechanical drilling or chemical corroding. Additionally, the size and shape of via hole 3 can be varied depending on the particular application. For example, the via hole 3 may be a square, rectangle, circle, and the like.

At block 82, and as shown in FIG. 11, the surface of substrate 1 may be textured. Specifically, in some examples, an acid or alkali solution may be applied to the top surface 25 (front surface) and bottom surface 27 (rear surface) of the substrate 1 to form textured surface 23. In other examples, only the top surface 25 of substrate 1 may be textured. The textured surface 23 may include, for example, an irregular surface having concave or pyramid shaped protrusions having a height of about 1-7 μm. This may be done to improve light absorption. Additionally, the acid or alkali solution may be used to remove residue caused by the laser within via hole 3. In some examples, the surface of substrate 1 may be cleaned to remove dirt and metal impurities prior to texturing surfaces 25 and 27.

At block 83, and as shown in FIG. 12, the emitter may be formed. Specifically, the emitter 2 may be formed on the surface of the P-type or N-type semiconductor substrate 1. In some examples, the emitter 2 may be formed on the top surface 25/textured surface 23, back surface 27/textured surface 23, the inner hole wall 31, and sides of substrate 1. In other examples, the emitter 2 may be formed on the top surface 25/textured surface 23, the inner hole wall 31, and sides of substrate 1. In some examples, the emitter 2 may be formed by introducing N-type impurities into the surfaces of the P-type semiconductor substrate 1 or by introducing P-type impurities into the surfaces of the N-type semiconductor substrate 1. It should be appreciated that the process for forming N-type or P-type emitter 2 is not limited to the example described above, and that the emitter 2 may be formed, for example, by high temperature diffusion of $POCL_3$ or $BBR_3$ into the surface of substrate 1 or by implanting N-type impurities or P-type impurities into the P-type or N-type semiconductor substrate 1. The performance of device 90 depends at least in part on the density, deepness, and uniformity of the diffusion.

Figure 13:
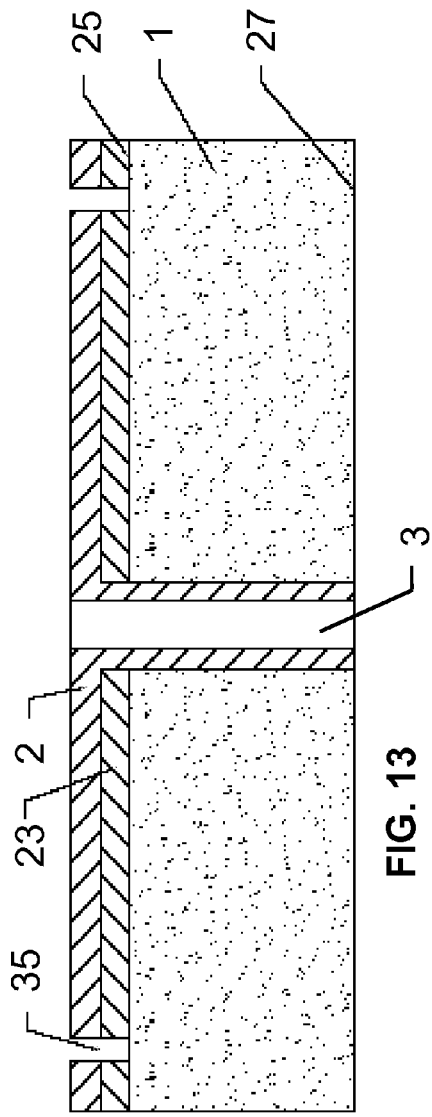

At block 84, and as shown in FIG. 13, the silicon may be etched. Specifically, etching may be performed on the front side edge 35, back side 27, and side surfaces of substrate 1, and may be performed at the same time. In some examples, the etching may be performed using an acid or alkali solution, such as HF/HNO3 acid. In these examples, the device may float on the top of the solution with a portion of the silicon semiconductor contacting the solution. In this way, the submerged portions of the device (e.g., back side emitter 2) may be removed, while leaving the P-N junction formed within via hole 3 and on the top surface of substrate 1 intact. Additionally or alternatively, etching may be performed using a chemical erosion paste. In these examples, the chemical pastes may be coated or printed on the surface of the front side edge emitter 35, bottom surface 27 of substrate 1, and sides of substrate 1. In this way, the front side edge emitter 35, back side emitter 2, and side surface emitter 2 may be selectively removed while leaving the remaining P-N junction intact. In some examples, the silicon semiconductor may be dried at room temperature for about 3 minutes, after which it may be cleaned using water at about 30° C. to complete the etching process. In yet other examples, the etching may be performed using other known processes, for example, by using a reactive plasma, such as $SF_6$, $O_2$, $N_2$, and the like. In some examples, the emitter may be exposed to the reactive plasma for about 15 minutes. In these examples, the flow of $SF_6$, may be about 200 sccm, the flow of $O_2$ may be about 30 sccm, the flow of $N_2$ may be about 300 sccm, the pressure may be about 50 Pa, and the power of the glow discharge may be about 700 W.

At block 85, phosphor-silicate glass (PSG) may be removed using any known PSG removal process.

Figure 14:
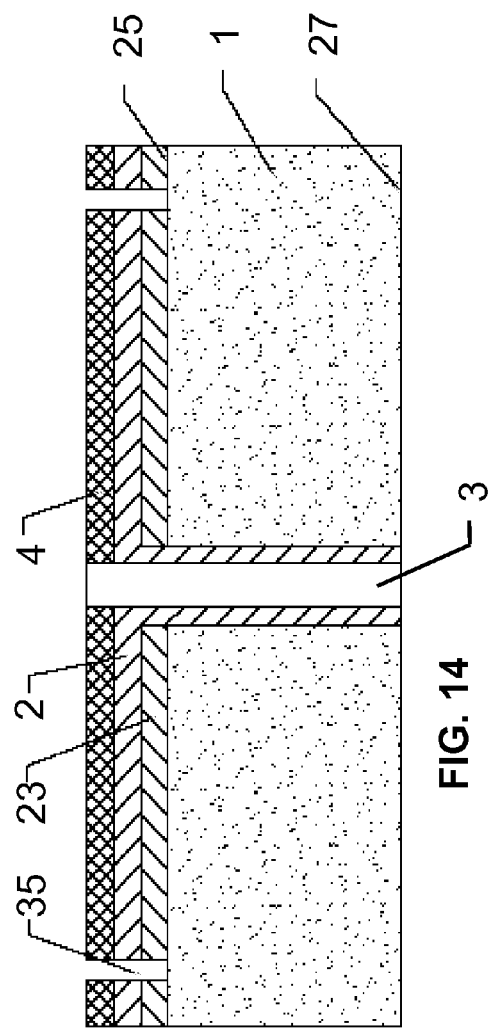

At block 86, and as shown in FIG. 14, an anti-reflective film may be deposited to reduce the amount of light reflection and increase the utilization ratio of the light. Specifically, an anti-reflective film 4 may be formed on the N-type or P-type emitter 2. In some examples, the anti-reflective film 4 may include SiN, $SiO_2$/SiN, two layers of SiN, three layers of SiN, $Si_3N_4$, $TiO_2$, or the like. In some examples, the anti-reflective film 4 may be formed, for example, by using a plasma chemical vapor deposition process. The surface of the front side emitter 2 may also be textured to improve the light-trapping properties of the cell. For example, the surface may be textured with a random arrangement of pyramids, inversed pyramids, honeycomb structures, and the like. Using these structures, a ray of light may be reflected toward a neighboring structure resulting in a greater amount of light absorption. To further improve the absorption of light, the light-trapping surface may be optically dark or black.

At block 87, and as shown in FIG. 15, contacts, or electrodes, and impurity layers may be formed. Specifically, some or all of the front electrodes 5 (not shown), rear electrodes 7, via hole electrode 9, via front collector 10, via rear collector 8, and impurity layer 6 may be formed at the same or at different times, and may be formed using printing-firing methods, deposition methods, plating methods, vacuum evaporating methods, spurting methods, or any other known process. For instance, in some printing-firing examples, front electrodes 5 (not shown), rear electrodes 7, via hole electrode 9, via front collector 10, via rear collector 8, and impurity layer 6 may be formed by screen printing, stencil printing, or the like, using a conductive paste composed mainly of glass frit and a conductive metal powder, such as silver, aluminum, copper, nickel, or the like. As discussed in greater detail below, the conductive paste may be fired at about 500 to 900° C. to form the electrode. There are many commercially available conductive pastes that are suitable for forming electrodes in a solar cell. For example, DuPont Microcircuit Materials has several types of silver-based DuPont Solamet photovoltaic metallization pastes for specific applications, including Solamet PV17A, PV16x, PVD2A, PV173, PV502, PV505, PV506, and PV701, as described by the website at http://www2.dupont.com/Photovoltaics/en_US/assets/downloads/pdf/PV_SolametProductOverview. pdf of Dupont. Targray Technology International Inc. of Canada also offers many types of the HeraSol Ag Paste compositions, including SOL953, SOL953, SOL90235H, SOL9273M, SOL9318, SOL230, CL80-9381M, CL80-9383M, SOL108, and SOL9400, as described by the website at http://www.targray-.com/solar/cystalline-cell-materials/silver-paste.php of Targray. Furthermore, some suppliers can customize their pastes to the specific manufacturing process to increase efficiency and provide wider processing windows. While specific pastes have been provided above, it should be appreciated that other known pastes may be used.

Figure 57:
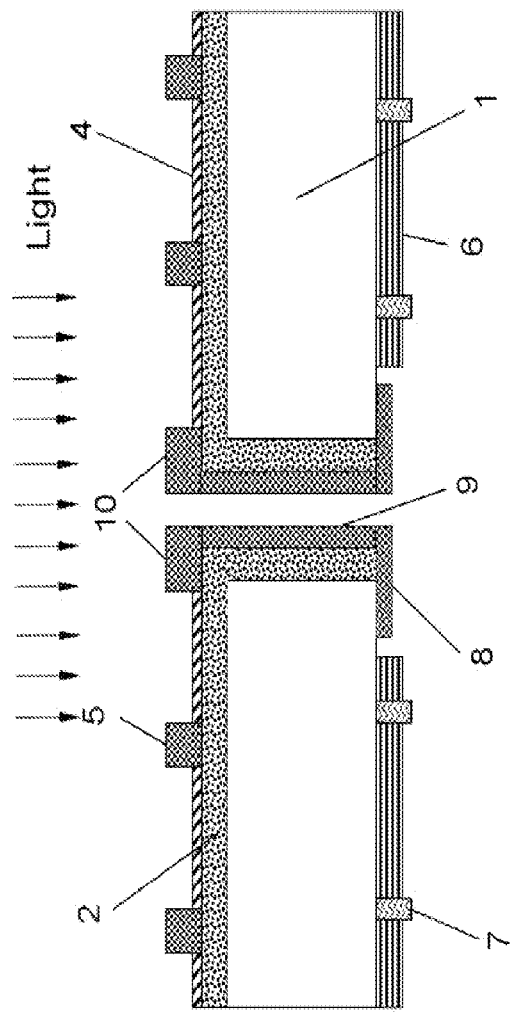
Figure 61:
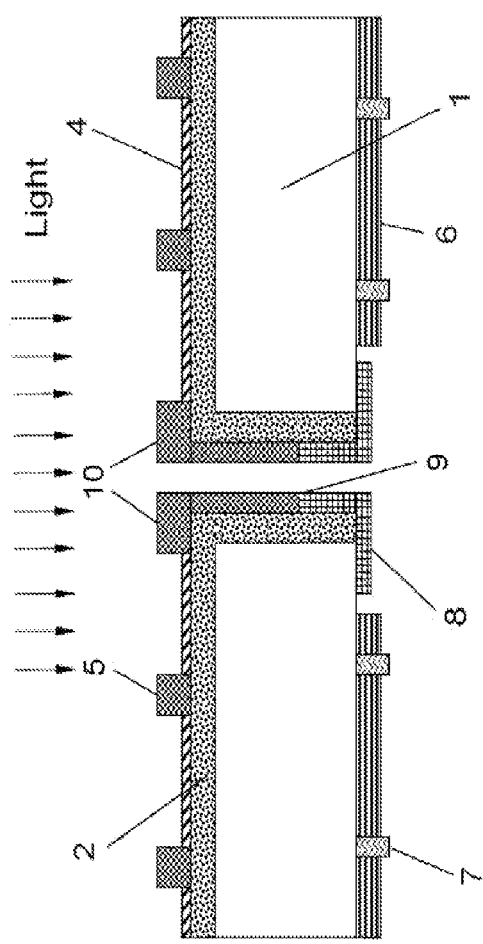

In some examples, such as that shown in FIG. 57, front electrodes 5, via front collector 10, via hole electrode 9, and via rear collector 8 may be formed from the same material. In other examples, such as those shown in FIGS. 55, 58, 60, and 61, some or all of front electrodes 5, via front collector 10, via hole electrode 9, and via rear collector 8 may be formed from the same or different materials. Additionally, as shown in FIG. 61, one or more of front electrodes 5, via front collector 10, via hole electrode 9, and via rear collector 8 may be formed from more than one type of material. Rear electrodes 7 can be formed from the same or a different material as via front collector 10, via hole electrode 9, and via rear collector 8. For instance, in some examples, front electrodes 5 (not shown), via hole electrode 9, via front collector 10, via rear collector 8, may formed be using a printing-firing method and may be made of silver. Rear electrodes 7 may also be formed using a printing-firing method but may be made of aluminum. In other examples, front electrodes 5 (not shown), via hole electrode 9, via front collector 10, via rear collector 8 may be made of aluminum while rear electrodes 7 may be made of silver.

Additionally, any one or more of via front collector 10, via hole electrode 9, and via rear collector 8 may be fully filled or hollow in shape. For example, as shown in FIG. 55, each of via front collector 10, via hole electrode 9, and via rear collector 8 may be fully filled. In some examples, this may be done by printing a fully filled via front collector 10 onto the surface of substrate 1, printing a fully filled via hole electrode 9 into via hole 3, and printing a fully filled via rear collector 8 onto the surface of substrate 1. In other examples, this may be done by printing a fully filled via front collector 10 onto the surface of substrate 1, inserting a fully filled via hole electrode 9 into via hole 3, and covering the bottom of via hole 3 with a fully filled via rear collector 8. In some examples, such as those shown in FIGS. 57, 58, and 61, each of via front collector 10, via hole electrode 9, and via rear collector 8 may be hollow. This may be done by printing a hollow front collector 10 onto the surface of substrate 1, printing a hollow via hole electrode 9 into via hole 3, and printing a hollow via rear collector 8 on the bottom of via hole 3. In yet other examples, such as those shown in FIG. 60, some of via front collector 10, via hole electrode 9, and via rear collector 8 may be fully filled while the remaining components are hollow. This may be done by printing a fully filled or hollow front collector 10 onto the surface of substrate 1, printing a fully filled or hollow via hole electrode 9 into via hole 3, and printing the bottom of via hole 3 with a fully filled or hollow via rear collector 8.

Additionally, as shown in FIG. 15, an impurity layer 6 may be formed by doping the bottom surface 27 of substrate 1 with P-type (for P-type substrate 1) or N-type impurities (for N-type substrate 1).

At block 88, the device may be co-fired, for example, between 500-900° C., to alloy together the electrodes that were printed on substrate 1 at block 87.

Using exemplary process 80, device 90 may be formed having no P-N junction on the back side of the device and without performing a separate laser isolation step to isolate the back surface from the via hole.

It should be appreciated by one or ordinary skill that the above described process may be used to make light to current converter devices having any combination of materials for impurity layer 6, front electrodes 5, rear electrodes 7, via hole electrode 9, via front collector 10, and via rear collector 8, and having a hole through all, a portion, or none of via hole electrode 9, via front collector 10, and via rear collector 8, such as those shown in FIGS. 55, 57, 58, 60, and 61.

In the second example, process 80 may be used to make exemplary light to current converter device 160 (and devices similar to light to current converter device 160), as shown in FIG. 16. Device 160 includes a P-N junction similar to that shown in FIG. 5.

In the second example, blocks 81-83 may be similar or identical to blocks 81-83 described above with respect to FIGS. 10-12 of the first example. At block 84, and as shown in FIG. 17, the silicon may be etched in a manner similar, but not identical, to that described above with respect to FIG. 13. Specifically, the front side edge 35 etching (not shown), back side 27 etching, side surface etching, and a portion of inner hole emitter 2 etching may be performed, and may be performed at the same time.

At block 85, PSG may be removed using any known PSG removal process.

At block 86, and as shown in FIG. 18, an anti-reflective film may be deposited to reduce the amount of light reflection and increase the utilization ratio of the light. Specifically, an anti-reflective film 4 may be formed on the N-type or P-type emitter 2 in a manner similar to that described above with respect to FIG. 14. The surface of the front side emitter 2 may also be textured to improve the light-trapping properties of the cell in a manner similar to that described above with respect to FIG. 14.

At blocks 87 and 88, and as shown in FIG. 19, contacts, or electrodes, and impurity layers may be formed. Specifically, the front electrodes 5 (not shown), rear electrodes 7, via hole electrode 9, via front collector 10, via rear collector 8, and impurity layer 6 may be formed in a manner similar to that described above with respect to FIG. 15. For instance, the electrodes and impurity layers may be screen printed, stencil printed, vacuum evaporated, or spurted onto substrate 1 and co-fired to alloy together the electrodes deposited on substrate 1.

Additionally, as shown in FIG. 19, a rear side impurity layer 6 may be formed by doping the bottom surface 27 of substrate 1 with P-type (for P-type substrate 1) or N-type impurites (for N-type substrate 1).

Using exemplary process 80, device 160 may be formed having no P-N junction on the back side of the device and without performing a separate laser isolation step to isolate the back surface from the via hole.

It should be appreciated by one or ordinary skill that the above described process may be used to make light to current converter devices having any combination of materials for front electrodes 5, rear electrodes 7, via hole electrode 9, via front collector 10, and via rear collector 8, and having a hole through all, a portion, or none of via hole electrode 9, via front collector 10, and via rear collector 8, such as those shown in FIGS. 56 and 59.

In the third example, process 80 may be used to make exemplary light to current converter device 200 (and devices similar to light to current converter device 200), as shown in FIG. 20. Device 200 includes a P-N junction similar to that shown in FIG. 7.

In the third example, blocks 81-83 may be similar or identical to blocks 81-83 described above with respect to FIGS. 10-12 of the first example. At block 84, and as shown in FIG. 21, the silicon may be etched in a manner similar, but not identical, to that described above with respect to FIG. 13. Specifically, the front side edge 35 etching (not shown), back side 27 etching, side surface etching, and inner via hole 3 etching may be performed, and may be performed at the same time.

At block 85, PSG may be removed using any known PSG removal process.

At block 86, and as shown in FIG. 22, an anti-reflective film may be deposited to reduce the amount of light reflection and increase the utilization ratio of the light. Specifically, an anti-reflective film 4 may be formed on the N-type or P-type emitter 2 in a manner similar to that described above with respect to FIG. 14. The surface of the front side emitter 2 may also be textured to improve the light-trapping properties of the cell in a manner similar to that described above with respect to FIG. 14.

Figure 23:
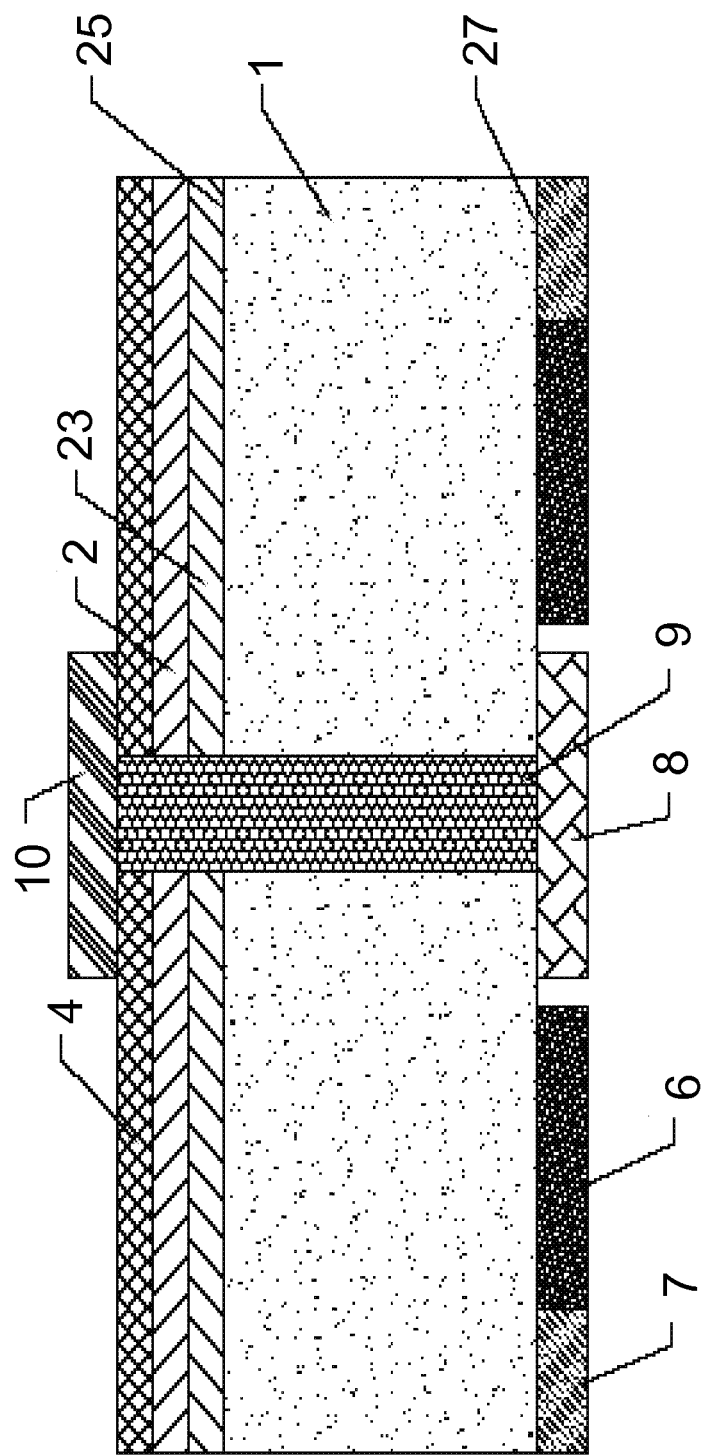

At blocks 87 and 88, and as shown in FIG. 23, contacts, or electrodes, and impurity layers may be formed. Specifically, the front electrodes 5 (not shown), rear electrodes 7, via hole electrode 9, via front collector 10, via rear collector 8, and impurity layer 6 may be formed in a manner similar to that described above with respect to FIG. 15. For instance, the electrodes and impurity layers may be screen printed, stencil printed, vacuum evaporated, or spurted onto substrate 1 and co-fired to alloy together the electrodes deposited on substrate 1.

Additionally, as shown in FIG. 23, impurity layer 6 may be formed by doping the bottom surface 27 of substrate 1 with P-type (for P-type substrate 1) or N-type impurites (for N-type substrate 1).

Using exemplary process 80, device 200 may be formed having no P-N junction on the back side of the device and without performing a separate laser isolation step to isolate the back surface from the via hole.

It should be appreciated by one or ordinary skill that the above described process may be used to make light to current converter devices having any combination of materials for front electrodes 5, rear electrodes 7, via hole electrode 9, via front collector 10, and via rear collector 8, and having a hole through all, a portion, or none of via hole electrode 9, via front collector 10, and via rear collector 8, such as those shown in FIGS. 62-67.

Figure 24:
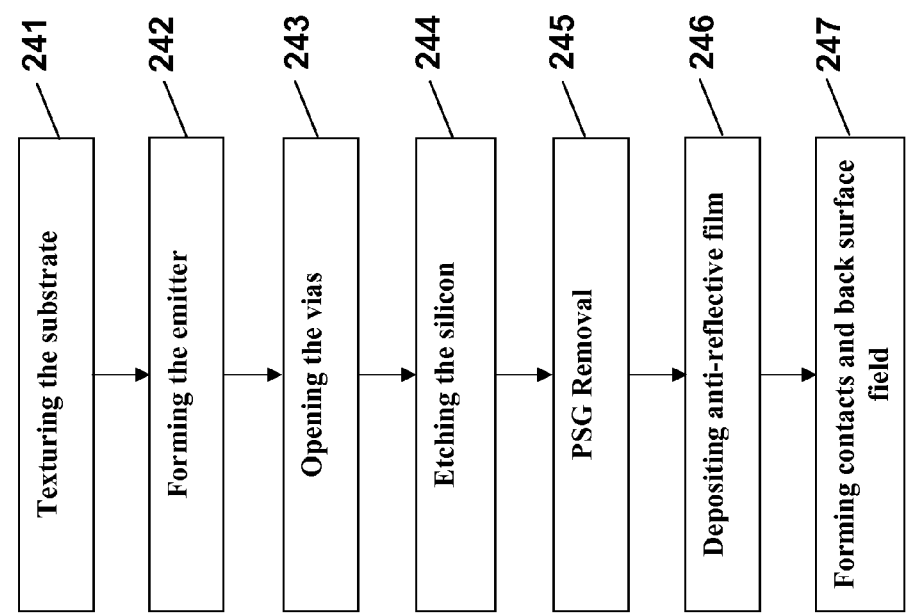
FIG. 24 shows an exemplary process for making an exemplary light to current converter device.

FIG. 24 illustrates another exemplary process 240 that may be used to make light to current converter devices, such as those described above. In particular, exemplary process 240 may be used to manufacture devices having P-N junctions similar or identical to those shown in FIG. 7. Various embodiments of process 240 are described below with reference to figures showing exemplary light to current converter devices at various stages of manufacture.

In the first example, process 240 may be used to make exemplary light to current converter device 200 (and devices similar to light to current converter device 200), as shown in FIG. 20. Device 200 includes a P-N junction similar to that shown in FIG. 7.

Figure 25:
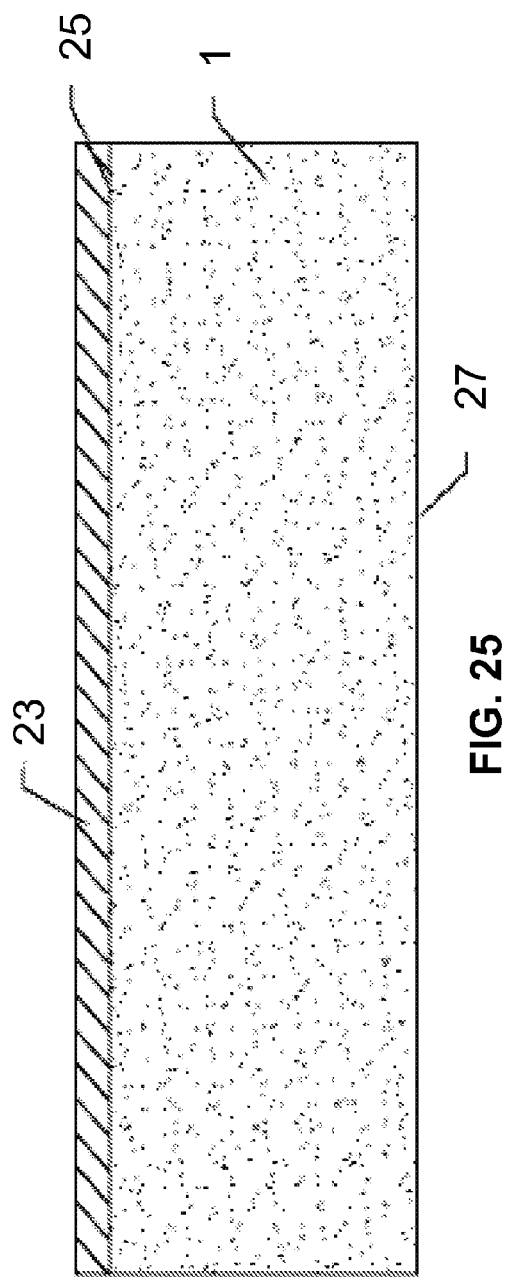

At block 241 of process 240, and as shown in FIG. 25, the surface of substrate 1 may be textured. Specifically, an acid or alkali solution may be applied to the top surface 25 of the substrate 1 to form textured surface 23. The textured surface 23 may include, for example, an irregular surface having concave or pyramid shaped protrusions having a height of about 1-7 µm. This may be done to improve light absorption. Additionally, the acid or alkali solution may be used to remove residue caused by the laser within via hole 3. In some examples, the surface of substrate 1 may be cleaned to remove dirt and metal impurities prior to texturing surface 25. In some examples, the semiconductor substrate 1 may have a resistance between 0.5-3 Ω/cm.

Figure 26:
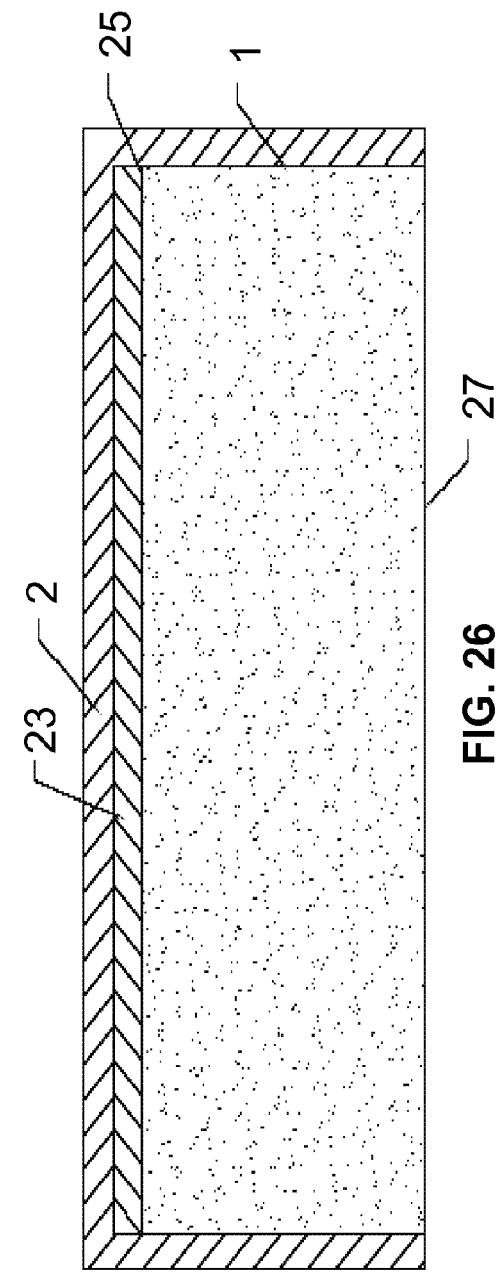

At block 242, and as shown in FIG. 26, the emitter may be formed. Specifically, the emitter 2 may be formed on the surface of the P-type or N-type semiconductor substrate 1. For example, the emitter 2 may be formed on the top surface 25/textured surface 23 and sides of substrate 1 in a manner similar to that described above with respect to block 83, as shown in FIG. 12.

Figure 27:
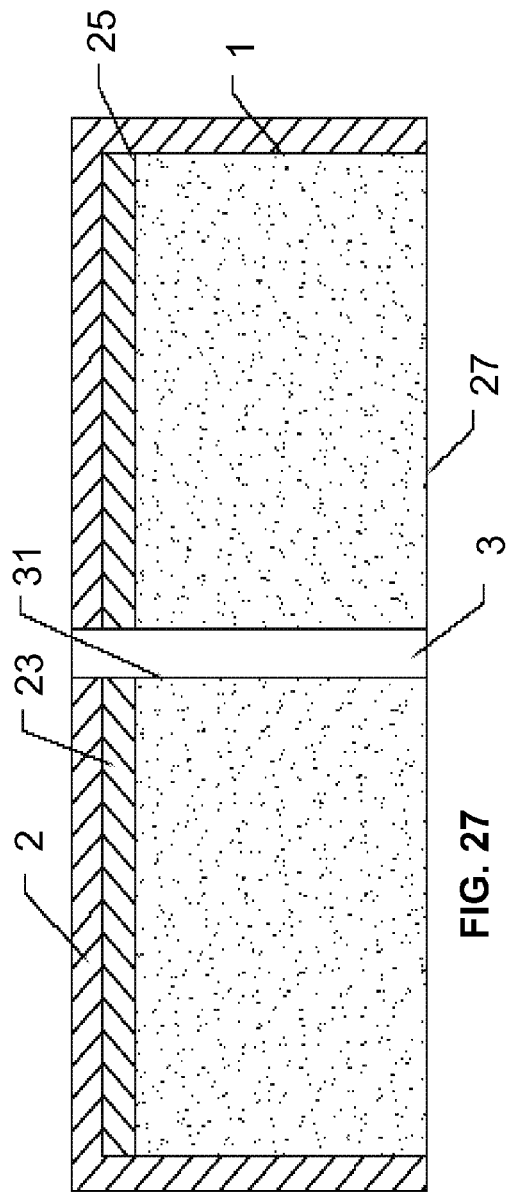
Figure 28:
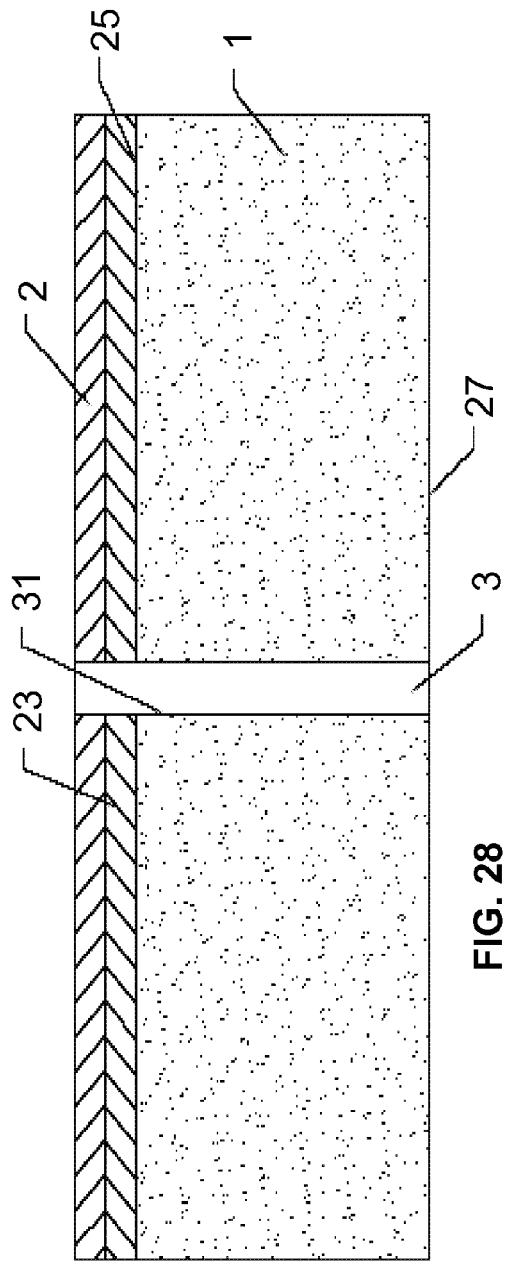

At block 243, and as shown in FIG. 27, vias may be opened into a semiconductor substrate in a manner similar to that described above with respect to block 81 of process 80, as shown in FIG. 10.

At block 244, and as shown in FIG. 18, the silicon may be etched in a manner similar, but not identical, to that described above with respect to FIG. 13. Specifically, the front side edge 35 etching (not shown) and side etching may be performed.

At block 245, PSG may be removed using any known PSG removal process.

At block 246, and as shown in FIG. 29, an anti-reflective film may be deposited to reduce the amount of light reflection and increase the utilization ratio of the light. Specifically, an anti-reflective film 4 may be formed on the N-type or P-type emitter 2 in a manner similar to that described above with respect to FIG. 14. The surface of the front side emitter 2 may also be textured to improve the light-trapping properties of the cell in a manner similar to that described above with respect to FIG. 14.

At block 247, and as shown in FIG. 30, contacts, or electrodes, and impurity layers may be formed. Specifically, the front electrodes 5 (not shown), rear electrodes 7, via hole electrode 9, via front collector 10, via rear collector 8, and impurity layers 6 may be formed in a manner similar to that described above with respect to FIG. 15. For instance, the electrodes and impurity layers may be screen printed, vacuum evaporated, or spurted onto substrate 1 and co-fired to alloy together the electrodes deposited on substrate 1.

Additionally, as shown in FIG. 30, impurity layer 6 may be formed by doping the bottom surface 27 of substrate 1 with P-type (for P-type substrate 1) or N-type impurites (for N-type substrate 1).

Using exemplary process 240, device 200 may be formed having no P-N junction on the back side of the device and without performing a separate laser isolation step to isolate the back surface from the via hole.

It should be appreciated by one or ordinary skill that the above described process may be used to make light to current converter devices having any combination of materials for front electrodes 5, rear electrodes 7, via hole electrode 9, via front collector 10, and via rear collector 8, and having a hole through all, a portion, or none of via hole electrode 9, via front collector 10, and via rear collector 8, such as those shown in FIGS. 62-67.

Figure 31:
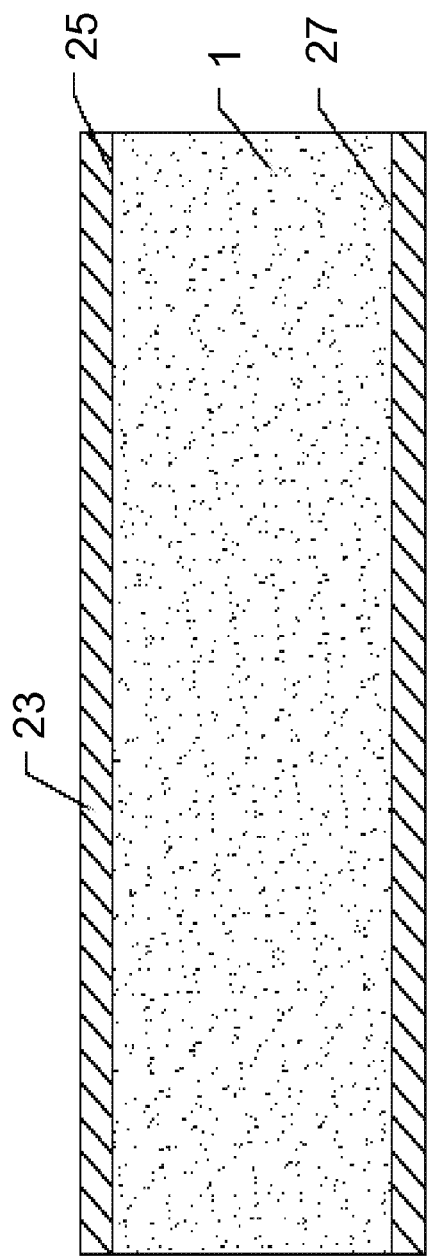
FIGS. 31-33 show the exemplary device of FIG. 20 at various stages of manufacture using the exemplary process shown in FIG. 24.
Figure 32:
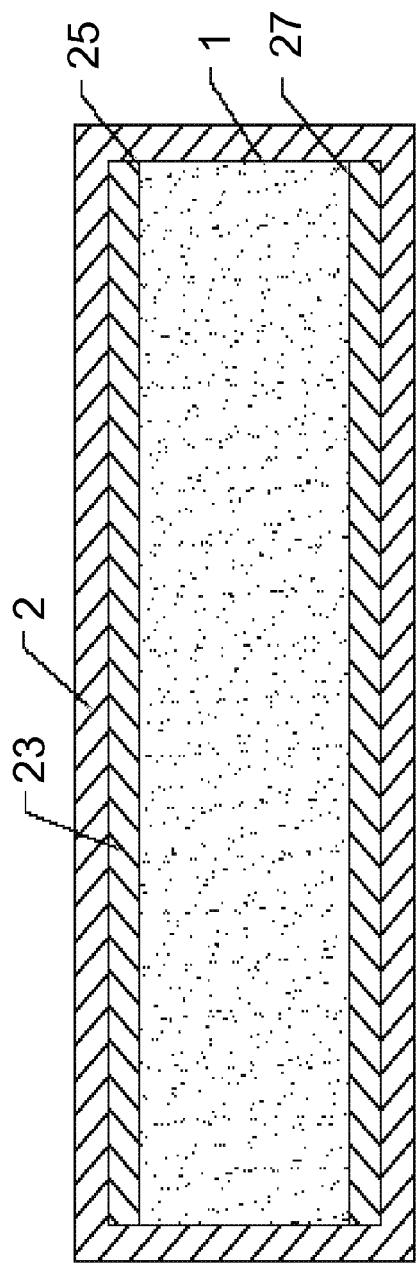
Figure 33:
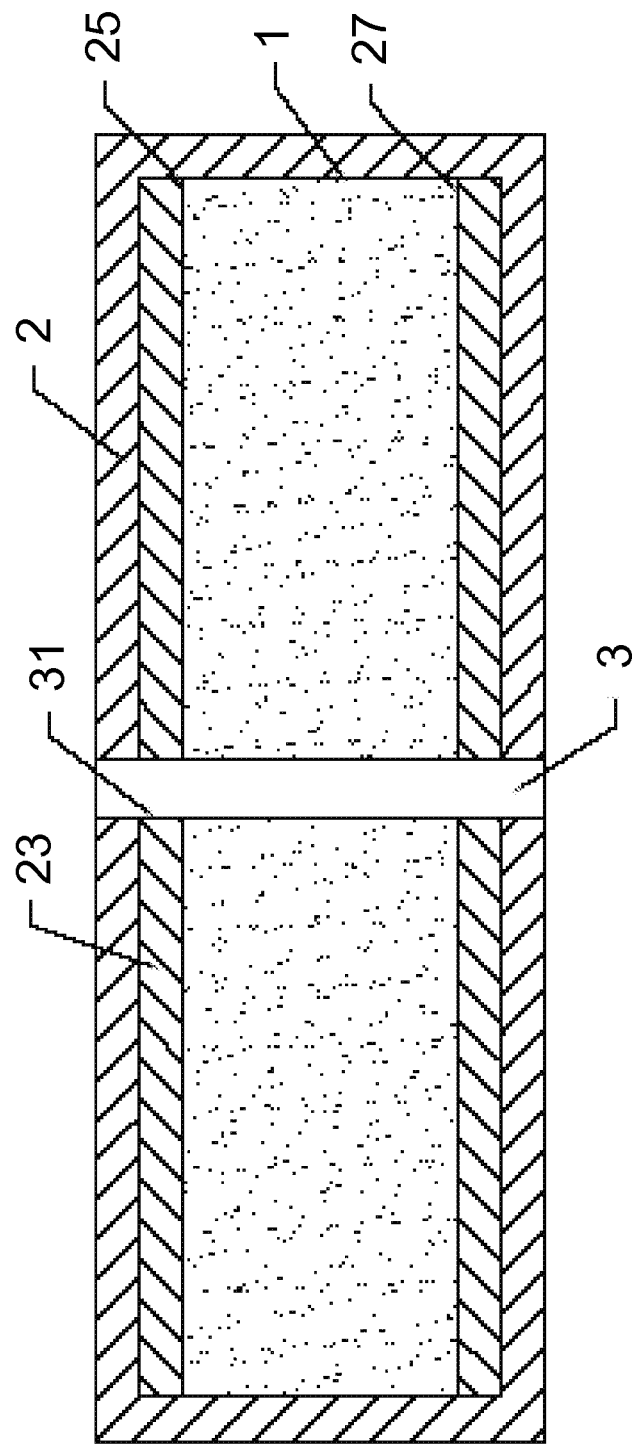

FIGS. 31-33 illustrate a second example of process 240 for making exemplary light to current converter device 200 (and devices similar to light to current converter device 200) having a P-N junction similar to that shown in FIG. 7.

At block 241 of process 240, and as shown in FIG. 31, the surface of substrate 1 may be textured. Specifically, an acid or alkali solution may be applied to the top surface 25 and bottom surface 27 of the substrate 1 to form textured surface 23. The textured surface 23 may include, for example, an irregular surface having concave or pyramid shaped protrusions having a height of about 1-7 µm. This may be done to improve light absorption. Additionally, the acid or alkali solution may be used to remove residue caused by the laser within via hole 3. In some examples, the surface of substrate 1 may be cleaned to remove dirt and metal impurities prior to texturing surfaces 25 and 27. In some examples, the semiconductor substrate 1 may have a resistance between 0.5-3 Ω/cm.

At block 242, and as shown in FIG. 32, the emitter may be formed. Specifically, the emitter 2 may be formed on the surface of the P-type or N-type semiconductor substrate 1. For example, the emitter 2 may be formed on the top surface 25/textured surface 23, bottom surface 27/textured surface 23, and sides of substrate 1 in a manner similar to that described above with respect to block 83, as shown in FIG. 12.

At block 243, and as shown in FIG. 33, vias may be opened into a semiconductor substrate in a manner similar, but not identical, to that described above with respect to FIG. 10.

In this second example, block 244 may be similar to block 244 described above with respect to FIG. 28. However, in addition to the front side edge 35 etching (not shown) and side etching performed in the first example described above with respect to FIG. 28, back side 27 etching may also be performed.

In this second example, blocks 245-247 may be similar or identical to blocks 245-247 described above with respect to FIGS. 29-30 of the first example.

Using exemplary process 240, device 200 may be formed having no P-N junction on the back side of the device and without performing a separate laser isolation step to isolate the back surface from the via hole.

It should be appreciated by one or ordinary skill that the above described process may be used to make light to current converter devices having any combination of materials for front electrodes 5, rear electrodes 7, via hole electrode 9, via front collector 10, and via rear collector 8, and having a hole through all, a portion, or none of via hole electrode 9, via front collector 10, and via rear collector 8, such as those shown in FIGS. 62-67.

Figure 34:
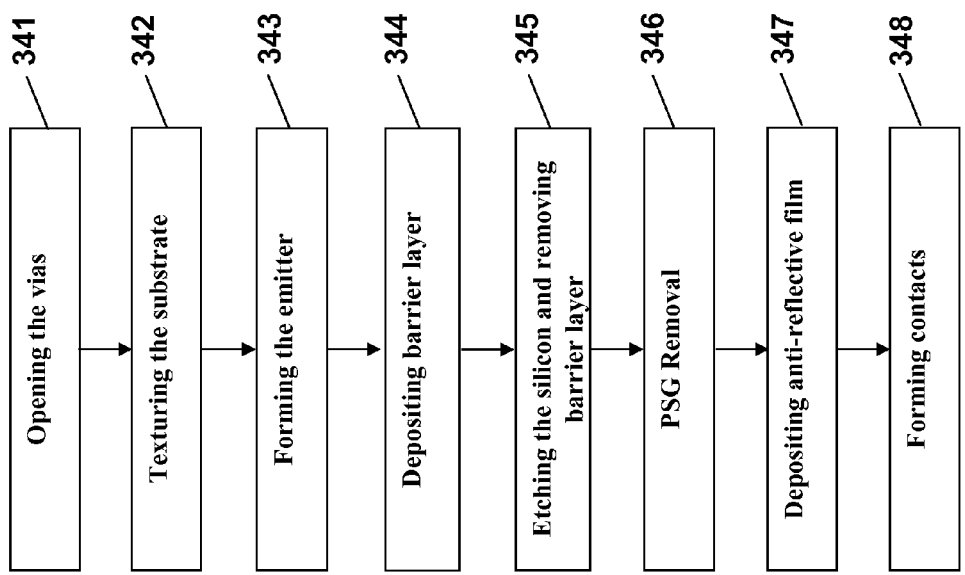
FIG. 34 shows an exemplary process for making an exemplary light to current converter device.

FIG. 34 illustrates another exemplary process 340 that may be used to make light to current converter devices, such as those described above. In particular, exemplary process 340 may be used to manufacture exemplary light to current converter device 90 (and devices similar to light to current converter device 90), as shown in FIG. 9. Device 90 includes a P-N junction similar to that shown in FIG. 4. Process 340 is described below with reference to figures showing exemplary light to current converter device 90 at various stages of manufacture.

In the second example, blocks 341-342 may be similar to blocks 81-82 of exemplary process 80 described above with respect to FIGS. 10-11. However, at block 343, and as shown in FIG. 35, the emitter may be formed in a manner similar, but not identical, to that described above with respect to FIG. 12. Specifically, in some examples, the emitter 2 may be formed on the top surface 25/textured surface 23, side surfaces, and the inner hole wall 31 of substrate 1. In other examples, the emitter 2 may be formed on the top surface 25/textured surface 23, back surface 27/textured surface 23, side surfaces, and the inner hole wall 31 of substrate 1.

At block 344, and as shown in FIG. 36, a barrier layer may be deposited. Specifically, a barrier layer 33 may be deposited on the inner hole wall 31 of semiconductor substrate 1. In some examples, barrier layer 33 may include silicon oxide, silicon resin, silicon nitride, other silicon material, titanium oxide, zinc oxide, or the like. In some examples, the barrier layer 33 may be deposited using processes, such as printing paste deposition, plasma-enhanced chemical vapor deposition, chemical oxidating, rapid thermal processing, magnetron sputtering, vacuum evaporating, and the like. In some examples, barrier layer 33 may include silicon oxide having a thickness of about 70 nm and may be deposited using plasma-enhanced chemical vapor deposition. During deposition, the temperature may be about 500° C., the flow of $N_2O$ may be about 7 slm, the flow of $SiH_4$ may be about 200 sccm, the pressure may be about 10 mTorr, and the time for depositing may be about 9 minutes.

Figure 37:
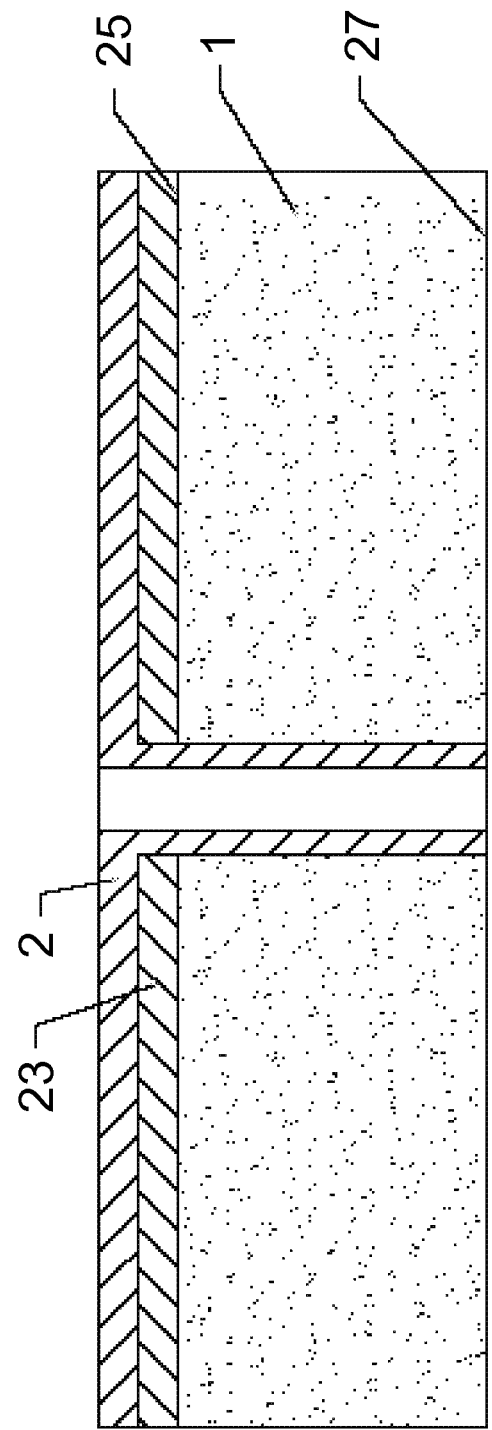

At block 345, and as shown in FIG. 37, the silicon may be etched and the barrier layer may be removed. Specifically, front side edge 35 (not shown) may be etched into emitter 2 and textured surface 23 using a chemical solution, such as HF/HNO3. Additionally, back side 27 etching and side surface etching may be performed, and may be performed at the same time. In some examples, the etching may be performed using an acid or alkali solution. In these examples, the device may float on the top of solution with a portion of the silicon semiconductor contacting the solution. In this way, the submerged portions of the device (e.g., back side emitter 2 and side surface emitter 2) may be removed, while leaving the P-N junction formed within via hole 3 and on the top surface of substrate 1. In these examples, the barrier layer 33 may protect the P-N junction within via hole 3 from being etched away. Additionally or alternatively, etching may be performed using a chemical erosion paste. In these examples, the chemical pastes may be coated or printed on the surface of the front side edge emitter 35, bottom surface 27 of substrate 1, and side of substrate 1. In this way, the front side edge emitter 35 and back side emitter 2, and side surface emitter 2 may be selectively removed while leaving the remaining P-N junction intact. In yet other examples, the etching may be performed using other known processes, for example, by using a reactive plasma, such as $SF_6$, $O_2$, $N_2$, and the like. In some examples, the emitter may be exposed to the reactive plasma for about 15 minutes. In these examples, the flow of $SF_6$, may be about 200 sccm, the flow of $O_2$ may be about 30 sccm, the flow of $N_2$ may be about 300 sccm, the pressure may be about 50 Pa, and the power of the glow discharge may be about 700 W. The barrier layer 33 may then be removed using a chemical etching process, with the chemical solution depending on the material used for barrier layer 33. For example, lye having a temperature of about 20° C.-90° C. and a concentration of 0.05%-10% may be used.

Blocks 346-348 may be similar to blocks 85-88 of exemplary process 80 described above with respect to FIGS. 14-15.

Using exemplary process 340, device 90 may be formed having no P-N junction on the back side of the device and without performing a separate laser isolation step to isolate the back surface from the via hole.

It should be appreciated by one or ordinary skill that the above described process may be used to make light to current converter devices having any combination of materials for front electrodes 5, rear electrodes 7, via hole electrode 9, via front collector 10, and via rear collector 8, and having a hole through all, a portion, or none of via hole electrode 9, via front collector 10, and via rear collector 8, such as those shown in FIGS. 55, 57, 58, 60, and 61.

Figure 38:
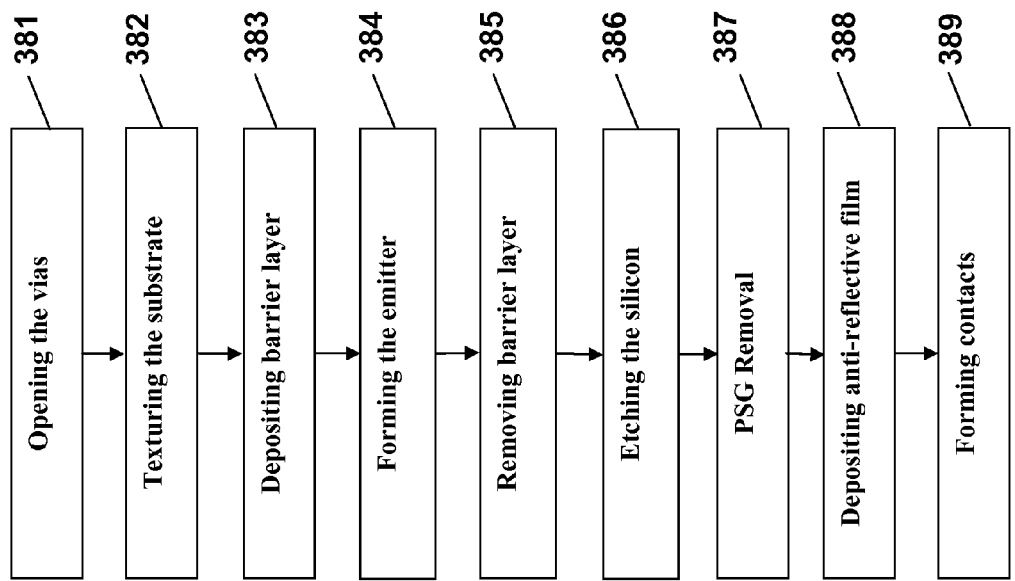
FIG. 38 shows an exemplary process for making an exemplary light to current converter device.

FIG. 38 illustrates another exemplary process 380 that may be used to make light to current converter devices, such as those described above. In particular, exemplary process 380 may be used to manufacture exemplary light to current converter device 200 (and devices similar to light to current converter device 200) having a P-N junction similar to that shown in FIG. 7. Process 380 is described below with reference to figures showing exemplary light to current converter device 200 at various stages of manufacture.

Blocks 381-382 of process 380 may be similar or identical to blocks 81-82 of exemplary process 80 described above with respect to FIGS. 10-11. However, at block 383, and as shown in FIG. 39, a barrier layer may be deposited in a manner similar, but not identical, to that described above with respect block 344 and shown in FIG. 36. Specifically, a barrier layer 33 may be deposited on the back surface 27/textured surface 23 and the inner hole wall 31 of semiconductor substrate 1. In some examples, barrier layer 33 may include silicon oxide, silicon resin, silicon nitride, other silicon material, titanium oxide, zinc oxide, or the like. In some examples, the barrier layer 33 may be deposited using processes, such as printing paste deposition, plasma-enhanced chemical vapor deposition, chemical oxidating, rapid thermal processing, magnetron sputtering, vacuum evaporating, and the like. In some examples, barrier layer 33 may include silicon oxide having a thickness of about 70 nm and may be deposited using plasma-enhanced chemical vapor deposition. During deposition, the temperature may be about 500° C., the flow of $N_2O$ may be about 7 slm, the flow of $SiH_4$ may be about 200 sccm, the pressure may be about 10 mTorr, and the time for depositing may be about 9 minutes.

At block 384, and as shown in FIG. 40, the emitter may be formed. Specifically, the emitter 2 may be formed on the surface of the P-type or N-type semiconductor substrate 1. For example, the emitter 2 may be formed on the top surface 25/textured surface 23 and side surfaces of substrate 1 by introducing N-type impurities into the surfaces of the P-type semiconductor substrate 1 or by introducing P-type impurities into the surfaces of the N-type semiconductor substrate 1. The barrier layer 33 prevents the emitter 2 from being formed on the back surface 27/textured surface 23 and the inner hole wall 31 of semiconductor substrate 1. It should be appreciated that the process for forming N-type or P-type emitter 2 is not limited to the example described above, and that the emitter 2 may be formed, for example, by high temperature diffusing of $POCL_3$ or $BBR_3$ into the surface of substrate 1 or by implanting N-type impurities or P-type impurities into the P-type or N-type semiconductor substrate 1. The performance of device 730 depends at least in part on the density, deepness, and uniformity of the diffusion.

At block 385, and as shown in FIG. 41, the barrier layer may be removed in a manner similar to that described above with respect to block 345, as shown in FIG. 37.

At block 386, and as shown in FIG. 42, the silicon may be etched. Specifically, the front side edge 35 etching (not shown), back side 27 etching, and side surface etching may be performed in a manner similar to that described above with respect to block 84, and as shown in FIG. 13.

Blocks 387-389 may be similar blocks 85-88 of exemplary process 80 described above with respect to FIGS. 22-23.

Using exemplary process 380, device 200 may be formed having no P-N junction on the back side of the device and without performing a separate laser isolation step to isolate the back surface from the via hole.

It should be appreciated by one or ordinary skill that the above described process may be used to make light to current converter devices having any combination of materials for front electrodes 5, rear electrodes 7, via hole electrode 9, via front collector 10, and via rear collector 8, and having a hole through all, a portion, or none of via hole electrode 9, via front collector 10, and via rear collector 8, such as those shown in FIGS. 62-67.

Figure 43:
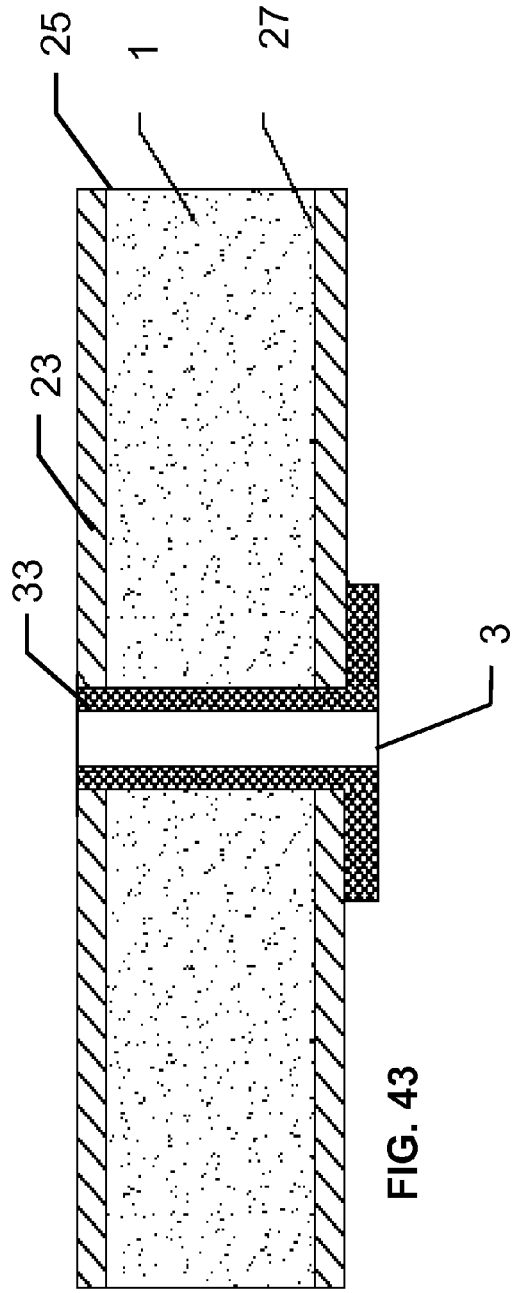
FIGS. 43-45 show the exemplary device of FIG. 20 at various stages of manufacture using the exemplary process shown in FIG. 38.
Figure 44:
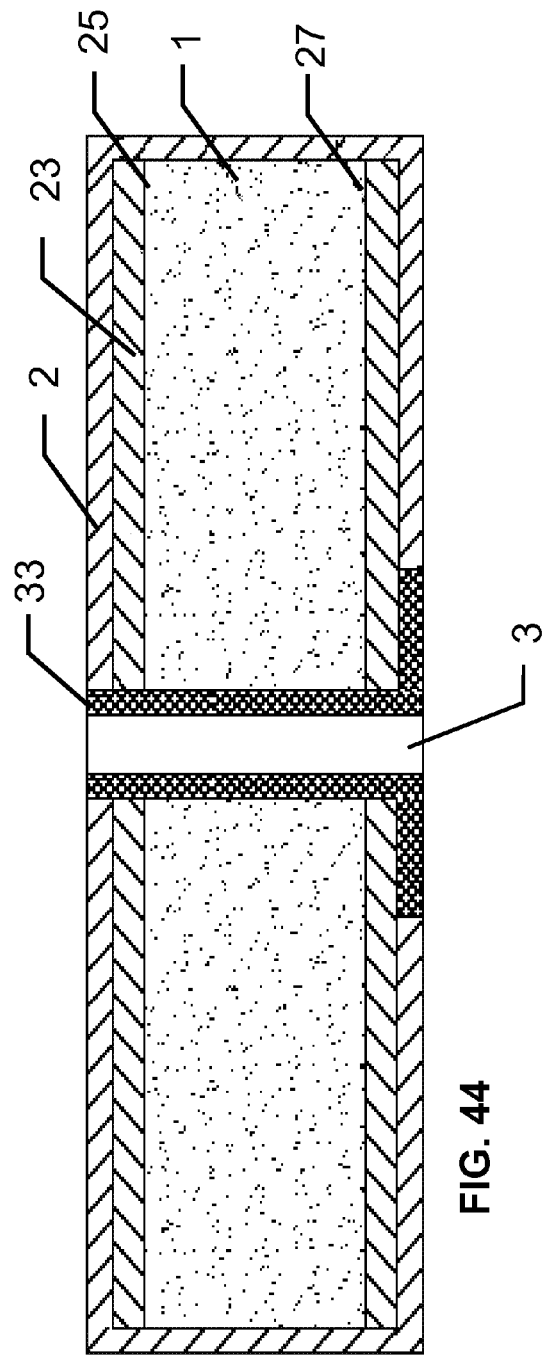
Figure 45:
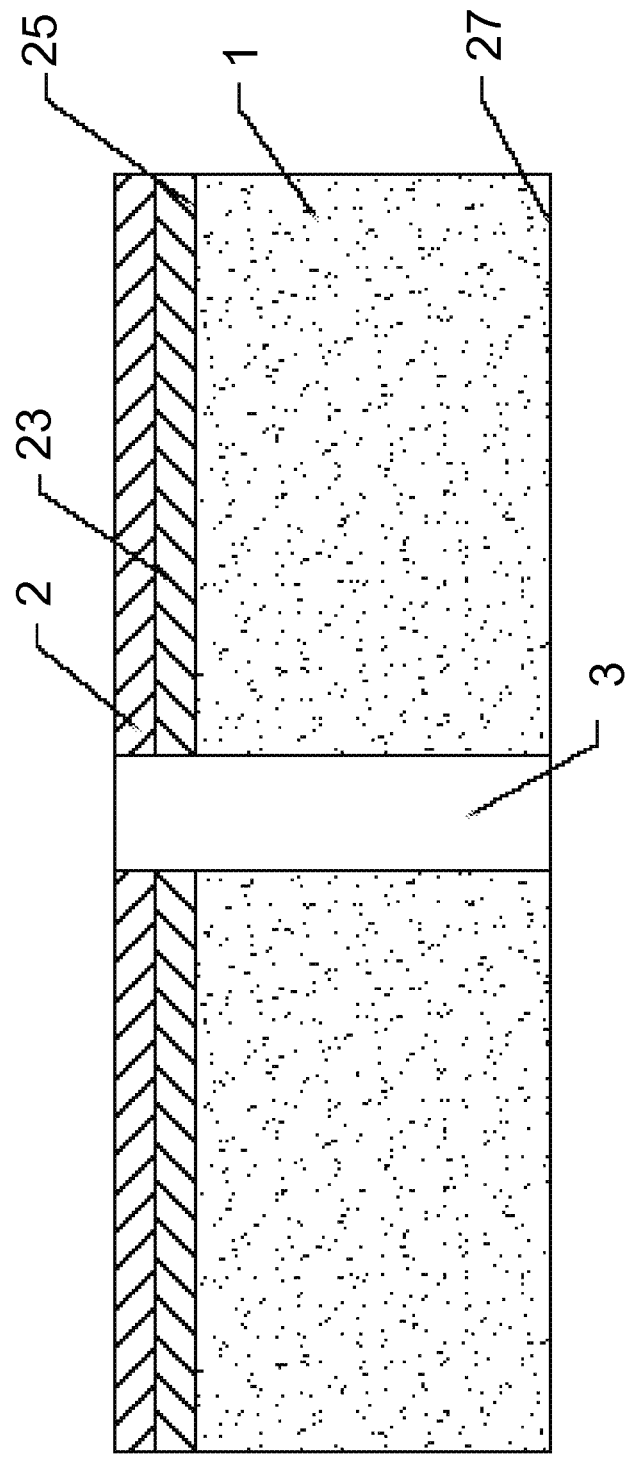

FIGS. 43-45 illustrate a second example of process 380 for making exemplary light to current converter device 200 (and devices similar to light to current converter device 200) having a P-N junction similar to that shown in FIG. 7.

Blocks 381-382 of process 380 may be similar or identical to blocks 81-82 of exemplary process 80 described above with respect to FIGS. 10-11. However, at block 383, and as shown in FIG. 43, a barrier layer may be deposited in a manner similar, but not identical, to that described above with respect block 344 and shown in FIG. 36. Specifically, the barrier layer may be formed on the inner hole wall 31 and a portion of back surface 27/textured surface 23 of semiconductor substrate 1. In some examples, barrier layer 33 may extend about 0.1 mm to 10 cm from the edge of via hole 3.

At block 384, and as shown in FIG. 44, the emitter may be formed in a manner similar to that described above with respect to block 83, as shown in FIG. 12. However, the barrier layer 33 may prevent the emitter from being formed no the inner surface of via hole 3 and the portion of back surface 27/textured surface 23 covered by barrier layer 33.

At blocks 385 and 386, and as shown in FIG. 45, the barrier layer may be removed in a manner similar to that described above with respect to block 345 of exemplary process 340, as shown in FIG. 37. The silicon may then be etched in a manner similar to that described above with respect to block 345 of exemplary process 340, as shown in FIG. 37.

Blocks 387-389 may be similar blocks 85-88 of exemplary process 80 described above with respect to FIGS. 22-23.

Using exemplary process 380, device 200 may be formed having no P-N junction on the back side of the device and without performing a separate laser isolation step to isolate the back surface from the via hole.

It should be appreciated by one or ordinary skill that the above described process may be used to make light to current converter devices having any combination of materials for front electrodes 5, rear electrodes 7, via hole electrode 9, via front collector 10, and via rear collector 8, and having a hole through all, a portion, or none of via hole electrode 9, via front collector 10, and via rear collector 8, such as those shown in FIGS. 62-67.

FIG. 46 illustrates another exemplary process 460 that may be used to make light to current converter devices, such as those described above. In particular, exemplary process 460 may be used to manufacture exemplary light to current converter device 471 (and devices similar to light to current converter device 471) having a P-N junction similar to that shown in FIG. 1. Process 460 is described below with reference to figures showing exemplary light to current converter device 471 at various stages of manufacture.

Blocks 461-462 of process 460 may be similar or identical to blocks 81-82 of exemplary process 80 described above with respect to FIGS. 10-11. At block 463, and as shown in FIG. 48, a barrier layer may be deposited in a manner similar to that described above with respect to FIG. 36. However, at block 463, the barrier layer 33 may be deposited on only the back surface 27/textured surface 23 of semiconductor substrate 1.

At block 464, and as shown in FIG. 49, a portion of the barrier layer 33 around vias 3 may be removed. In some examples, the barrier layer 33 within 0.1 mm to 10 cm from the edge of vias 3 may be removed. The barrier layer 33 may be removed in a manner similar to that described above with respect to block 345, as shown in FIG. 37. For example, a chemical erosion paste may be printed onto the portion of barrier layer 33 to be removed and the substrate 1 may be dried for about 3 minutes. After that time, water at about 30° C. may be used to wash the substrate. In some examples, the chemical erosion paste may include ammonium bifluoride or phosphoric acid.

At block 465, and as shown in FIG. 50, the emitter may be formed in a manner similar to that described above with respect to block 83, as shown in FIG. 12. Specifically, the emitter 2 may be formed on the top surface 25/textured surface 23, side surfaces of substrate 1, full inner surface of vias 3, and a portion of back surface 27/textured surface 23 that is not covered by barrier layer 33.

Figure 51:
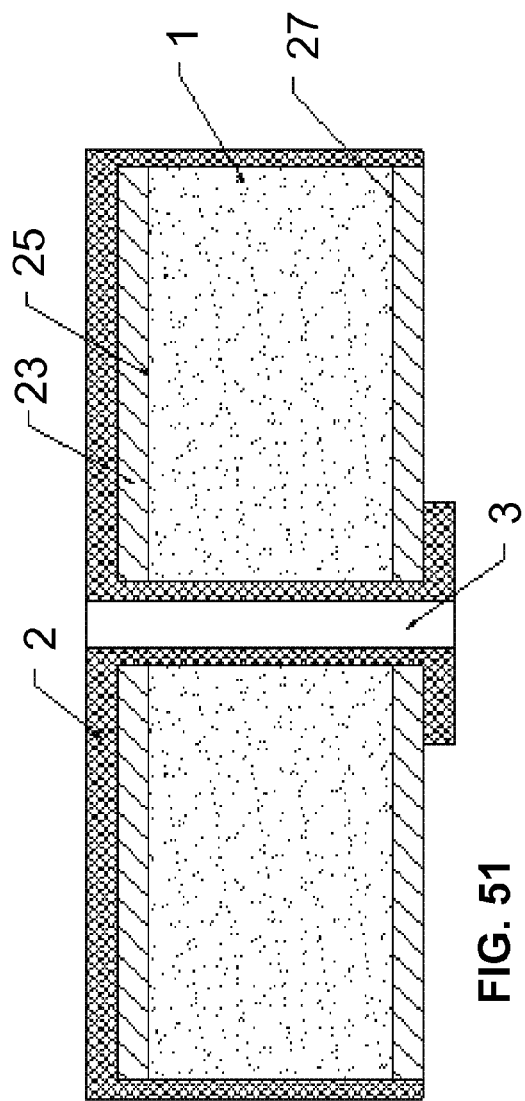

At block 466, and as shown in FIG. 51, the remaining barrier layer 33 may be removed in a manner similar to that described above with respect to with respect to block 345, as shown in FIG. 37. After removal of barrier layer 33, the emitter 2 located on the side surfaces, top surface 25, and bottom surface 27 of the substrate 1 may remain.

Figure 52:
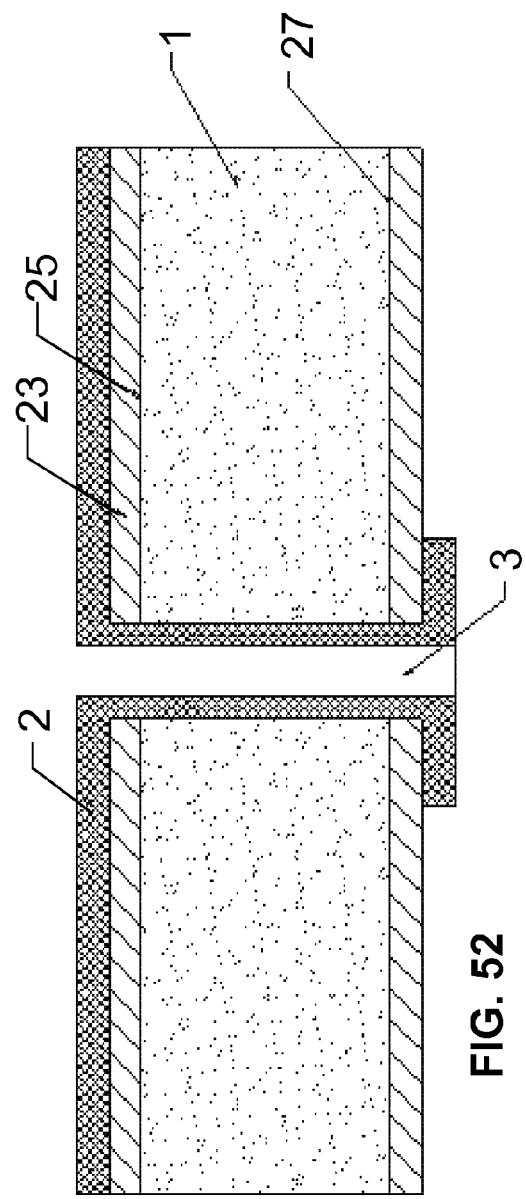

At block 467, and as shown in FIG. 52 the silicon may be etched in a manner similar to that described above with respect to block 84, as shown in FIG. 13. Specifically, the side surfaces of substrate 1 may be etched away.

Blocks 468-470, shown in FIGS. 53-54, may be similar blocks 85-88 of exemplary process 80 described above with respect to FIGS. 14-15.

Using exemplary process 460, device 471 may be formed having a P-N junction on only a portion of the back side of the device and without performing a separate laser isolation step to isolate the back surface from the via hole.

It should be appreciated by one or ordinary skill that the above described process may be used to make light to current converter devices having any combination of materials for front electrodes 5, rear electrodes 7, via hole electrode 9, via front collector 10, and via rear collector 8, and having a hole through all, a portion, or none of via hole electrode 9, via front collector 10, and via rear collector 8.

Various embodiments of light to current converter devices having exemplary P-N junctions similar or identical to those shown in FIGS. 4-7 and that may be made using the processes described above are described with respect to FIGS. 55-68.

FIG. 55 illustrates an exemplary light to current converter device 550 having a P-N junction similar to that shown in FIG. 4 and that may be made using exemplary processes 80 and 340. Specifically, device 550 includes a P-type or N-type semiconductor substrate 1 with one or more via holes 3 (e.g., 9, 13, 20, 25, 40, 48, 60, or 80 via holes 3) penetrating the substrate 1. An N-type (for P-type substrate 1) or P-type (for N-type substrate 1) emitter 2 may be formed on the front surface of the substrate 1 and the full inner surface of the via hole 3.

Device 550 may further include front electrodes 5 and one or more anti-reflective films 4, for example, one or more layers of SiN, $SiO_2$/SiN, $Si_3N_4$, $TiO_2$, SiNx, or the like. The one or more anti-reflective films 4 may be used to absorb additional light and improve light conversion efficiency. A via front collector 10 (electrode) may also be placed on a portion of emitter 2 and above via hole 3. Via hole 3 may be at least partially filled with a via hole electrode 9 that is electrically coupled to via front collector 10 and a via rear collector 8 (electrode) that may be disposed below via hole 3. Via front collector 10, via hole electrode 9 (electrode), and via rear collector 8 may collectively be referred to herein as a "through-hole electrode." Device 550 may further include rear electrodes 7 (or back electrodes) disposed below substrate 1. Front electrodes 5, via front collector 10, inner via hole electrode 9, via rear collector 8, and rear electrodes 7 may be made of any conductive material, such as metals, alloys, conductive pastes, conductive compounds, conductive films, or the like. In some examples, commercially available conductive pastes suitable for forming electrodes in a solar cell may be used. For example, DuPont Microcircuit Materials of the United States offers several types of silver-based DuPont Solamet photovoltaic metallization pastes, including Solamet PV17A, PV16x, PVD2A, PV173, PV502, PV505, PV506, and PV701, as described by the website at http://www2.dupont.com/Photovoltaics/en_US/assets/downloads/pdf/PV_SolametProductOverview. pdf of Dupont. Targray Technology International Inc. of Canada also offers many types of the HeraSol Ag Paste compositions, including SOL953, SOL953, SOL90235H, SOL9273M, SOL9318, SOL230, CL80-9381M, CL80-9383M, SOL108, and SOL9400, as described by the website at http://www.targray.com/solar/cystalline-cell-materials/silver-paste.php of Targray. Furthermore, some suppliers can customize their pastes to the specific manufacturing process to increase efficiency and provide wider processing windows. While specific pastes have been provided above, it should be appreciated that other known pastes may be used.

Additionally, front electrodes 5, via front collector 10, inner via hole electrode 9, via rear collector 8, and rear electrodes 7 may be made from the same or different materials, and may each be made of one or more materials. For instance, in some examples, front electrodes 5, via front collector 10, inner via hole electrode 9, and via rear collector 8 may be made of silver, while the rear electrodes 7 may be made of aluminum, or vice versa. In other examples, front electrodes 5, via front collector 10, inner via hole electrode 9, and via rear collector 8 may be made of aluminum, while the rear electrodes 7 may be made of silver. Moreover, the via front collector 10, the inner via hole electrode 9, and the via rear collector 8 can be hollow, partially filled, or fully filled, and may form a unitary body or may form multiple segments. In the example shown in FIG. 55, the via front collector 10, the inner via hole electrode 9, and the via rear collector 8 are fully filled.

Front electrodes 5, via front collector 10, inner via hole electrode 9, and the via rear collector 8 may be coupled together such that during operation, electric current may be generated by the light receiving surface of device 550 and directed to via front collector 10 by front electrodes 5. From via front collector 10, the current may be directed through via hole electrode 9 to via rear collector 8. Rear electrodes 7 may be electrically isolated from via rear collector 8 and may collect opposite conductivity current on the back surface of device 550. In this way, electrodes of opposite conductivity may be placed on the same side (back surface) of device 550 without interfering with light absorption on the front surface of the device.

Device 550 may further include impurity layer 6. In some examples, an $N^+$ (for N-type substrate 1) or $P^+$ (for P-type substrate 1) impurity layer 6 may be positioned on the bottom of substrate 1 to form a back surface field. In other examples, impurity layer 6 may include an $N^+$ (for N-type substrate 1) doping region, $P^+$ (for P-type substrate 1) doping region, SiNx, $SiO_2$, or combinations thereof. Device 550 may further include light-trapping structures on the light-receiving surface of the device. In some examples, the surface may be textured with a random arrangement of pyramids, inversed pyramids, honeycomb structures, and the like. Using these structures, a ray of light may be reflected toward a neighboring structure resulting in a greater amount of light absorption. To further improve the absorption of light, the light-trapping surface may be optically dark or black.

FIG. 56 illustrates another exemplary light to current converter device 560 having a P-N junction similar to that shown in FIG. 5 and that may be made using exemplary process 80. Device 560 may be similar to device 550, except that the emitter 2 may symmetrically cover only a portion of the inner surface of the via hole 3.

FIG. 57 illustrates another exemplary light to current converter device 570 having a P-N junction similar to that shown in FIG. 4 and that may be made using exemplary processes 80 and 340. Device 570 may include features similar to device 550, except that via front collector 10, via hole electrode 9, and a via rear collector 8 of device 570 may be hollow. Additionally, in the illustrated example, front electrodes 5, via front collector 10, via hole electrode 9, and via rear collector 8 may be made from the same material.

Figure 58:
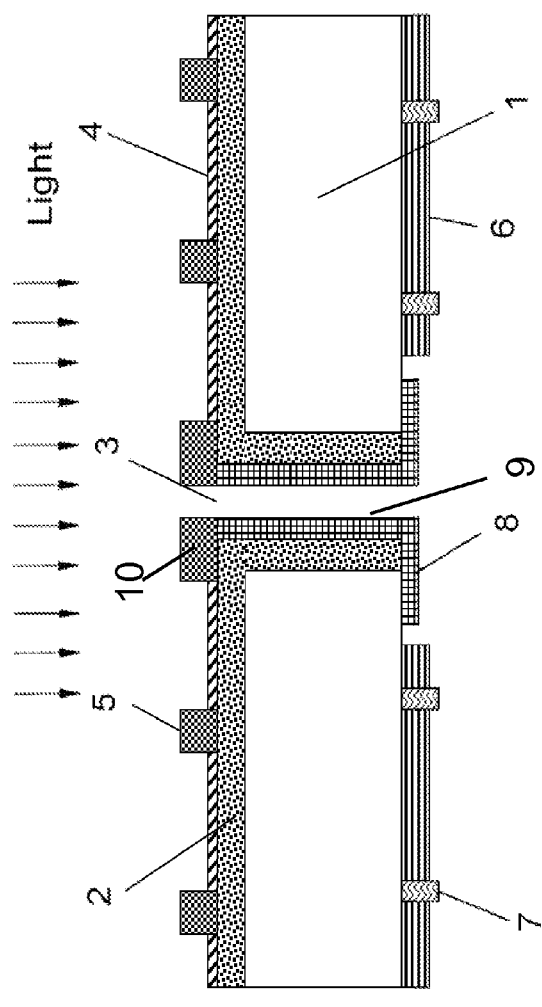

FIG. 58 illustrates another exemplary light to current converter device 580 having a P-N junction similar to that shown in FIG. 4 and that may be made using exemplary processes 80 and 340. Device 580 may be similar to device 570, except that in device 580, front electrodes 5 may be made from the same material as via front collector 10, while via hole electrode 9 may be made from the same material as via rear collector 8.

FIG. 59 illustrates another exemplary light to current converter device 590 having a P-N junction similar to that shown in FIG. 5 and that may be made using exemplary process 80. Device 590 may be similar to device 560, except that in device 590, front electrodes 5, via front collector 10, and via hole electrode 9 may be made from the same material while via rear collector 8 may be made from a different material.

FIG. 60 illustrates another exemplary light to current converter device 600 having a P-N junction similar to that shown in FIG. 4 and that may be made using exemplary processes 80 and 340. Device 600 may be similar to device 550, except that in device 600, via front collector 10 and via hole electrode 9 may be hollow while via rear collector 8 is fully filled. Additionally, front electrodes 5 may be made from a first material, via front collector 10 and via rear collector 8 may be made from a second material, and via hole electrode 9 may be made from a third material.

FIG. 61 illustrates another exemplary light to current converter device 610 having a P-N junction similar to that shown in FIG. 4 and that may be made using exemplary processes 80 and 340. Device 610 may be similar to device 570, except that in device 610, front electrodes 5, via front collector 10, and a portion of via hole electrode 9 may be made from the same material, while the remaining portion of via hole electrode 9 and via rear collector 8 may be made from a different material. Additionally, impurity layer 6 may include a layer of SiNx and SiO$_2$.

Figure 62:
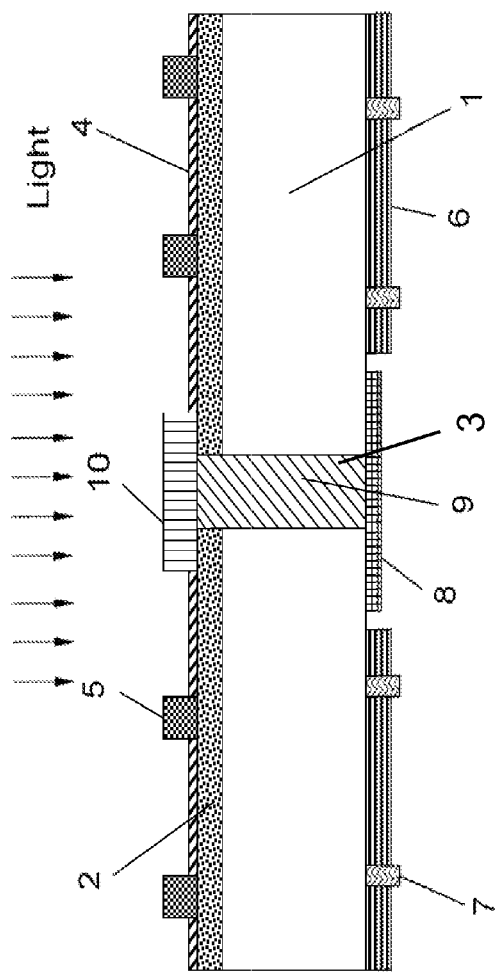

FIG. 62 illustrates an exemplary light to current converter device 620 having a P-N junction similar to that shown in FIG. 7 and that may be made using exemplary processes 80, 340, and 380. Device 620 may be similar to device 550, except that the emitter 2 covers only the front surface of substrate 1 and does not cover the inner surface of the via hole 3.

FIG. 63 illustrates an exemplary light to current converter device 630 having a P-N junction similar to that shown in FIG. 7 and that may be made using exemplary processes 80, 340, and 380. Device 630 may be similar to device 620, except that front electrodes 5 and via front collector 10 may be made of the same material while via hole electrode 9 and via rear collector 8 may be made from a different material. Additionally, in some examples, impurity layer 6 may include a layer of an N$^+$ (for N-type substrate 1) and SiO$_2$.

FIG. 64 illustrates an exemplary light to current converter device 640 having a P-N junction similar to that shown in FIG. 7 and that may be made using exemplary processes 80, 340, and 380. Device 640 may be similar to device 620 except that via front collector 10, via hole electrode 9, and via rear collector 8 may be hollow. Additionally, front electrodes 5, via front collector 10, via hole electrode 9, and via rear collector 8 may be made from the same material and may form a unitary body.

Figure 65:
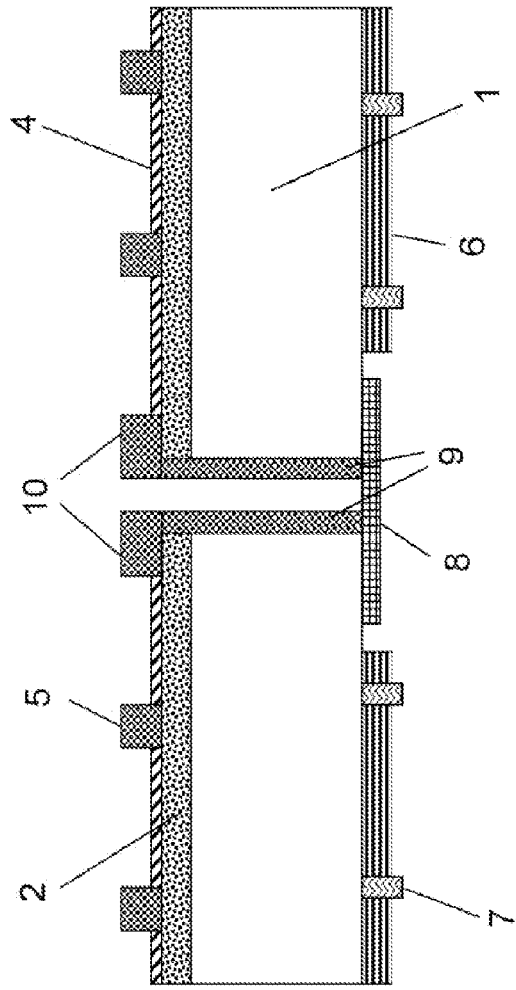

FIG. 65 illustrates another exemplary light to current converter device 650 having a P-N junction similar to that shown in FIG. 7 and that may be made using exemplary processes 80, 340, and 380. Device 650 may be similar to device 620 except that via front collector 10 and via hole electrode 9 may be hollow while via rear collector 8 may be fully filled. Additionally, front electrodes 5, via front collector 10, and via hole electrode 9 may be made from the same material while via rear collector 8 may be made from a different material.

Figure 66:
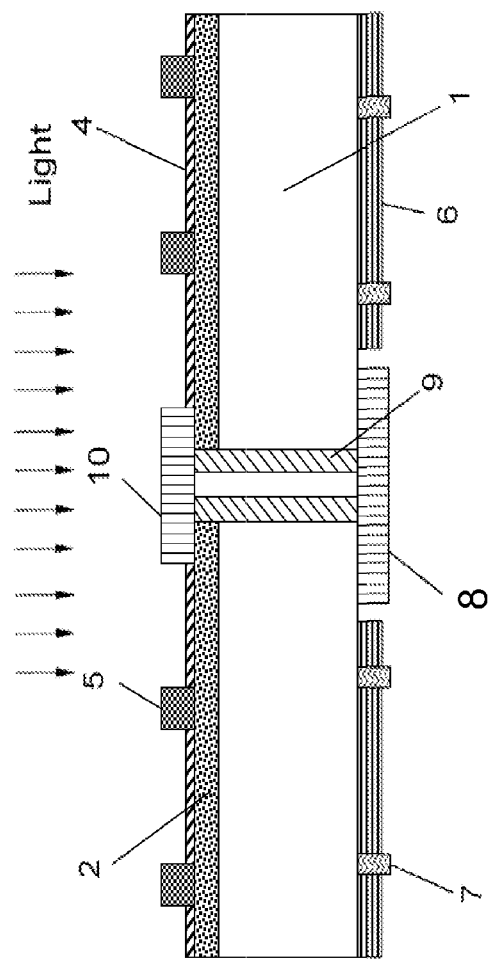

FIG. 66 illustrates another exemplary light to current converter device 660 having a P-N junction similar to that shown in FIG. 7 and that may be made using exemplary processes 80, 340, and 380. Device 660 may be similar to device 620 except that via front collector 10 and via rear collector 8 may be fully filled while via hole electrode 9 may be hollow. Additionally, front electrodes 5 may be made from a first material, via front collector 10 and via rear collector 8 may be made from a second material, and via hole electrode 9 may be made from a third material.

Figure 67:
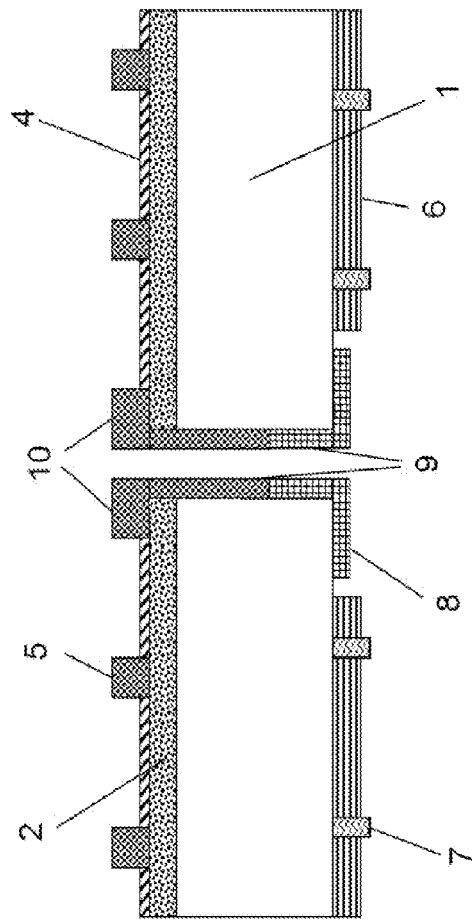

FIG. 67 illustrates another exemplary light to current converter device 670 having a P-N junction similar to that shown in FIG. 7 and that may be made using exemplary processes 80, 340, and 380. Device 670 may be similar to device 640 except that front electrodes 5, via front collector 10, and a portion of via hole electrode 9 may be made from the same material, while the remaining portion of via hole electrode 9 and via rear collector 8 may be made from a different material.

Figure 68:
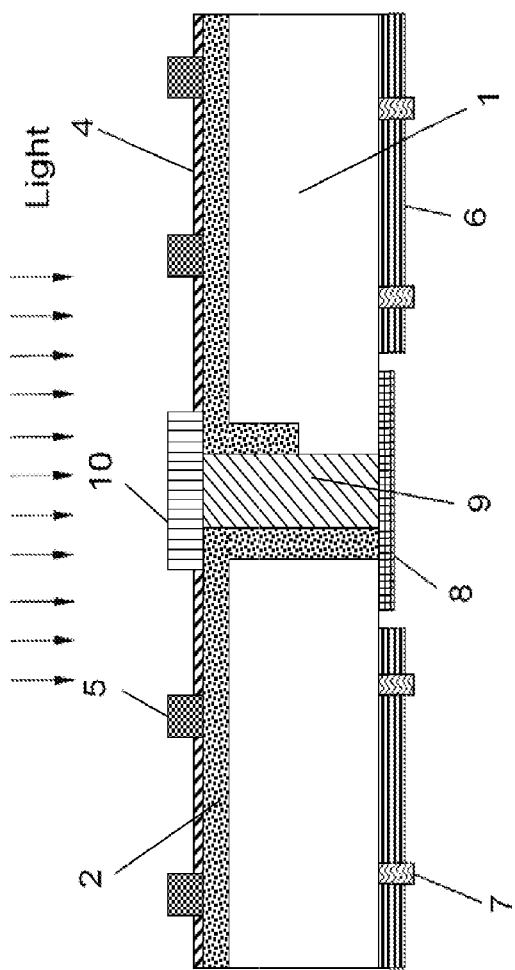

FIG. 68 illustrates another exemplary light to current converter device 680 having a P-N junction similar to that shown in FIG. 6. Device 680 may be similar to device 550, except that the emitter 2 asymmetrically covers only a portion of the inner surface of the via hole 3.

It should be appreciated by one or ordinary skill that any one of the P-N junctions shown in FIGS. 1 and 4-7 may be used to make light to current converter devices having any combination of materials for front electrodes 5, rear electrodes 7, via hole electrode 9, via front collector 10, and via rear collector 8, and having a hole through all, a portion, or none of via hole electrode 9, via front collector 10, and via rear collector 8.

In some examples, the light to current converter devices described above may have an average cell efficiency (photo to current efficiency) of about 18.7% and a cell power of about 4.47 W when using a monocrystalline silicon substrate. Conventional light to current converter devices having a monocrystalline silicon substrate may typically have a cell efficiency of about 17.8% and produce a cell power of about 4.25 W.

In other examples, the light to current converter devices described above may have an average cell efficiency of about 17.3% and a cell power of about 4.21 W when using a polycrystalline silicon substrate. Conventional light to current converter devices having a polycrystalline silicon substrate may typically have a cell efficiency of about 16.5% and produce a cell power of about 4.01 W.

Although embodiments have been fully described with reference to the accompanying drawings, it is to be noted that various changes and modifications will become apparent to those skilled in the art. Such changes and modifications are to be understood as being included within the scope of the various embodiments as defined by the appended claims.

What is claimed is:

1. A method for making a light to current converter device, the method comprising:
   generating a via hole through a semiconductor substrate of a first conductive type, the via hole extending from a front surface of the semiconductor substrate to a rear surface of the semiconductor substrate;
   forming a textured front surface on the front surface of the semiconductor substrate;
   forming a textured rear surface on the rear surface of the semiconductor substrate;
   forming a semiconductor layer of a second conductive type on at least the textured front surface, the textured rear surface, and an inner surface of the via hole, wherein the second conductive type is opposite the first conductive type; and
   etching the semiconductor layer of the second conductive type, wherein etching the semiconductor layer of the second conductive type comprises:
      removing the semiconductor layer of the second conductive type formed on the textured rear surface; and
      removing all of the semiconductor layer of the second conductive type formed on the inner surface of the via hole.

2. The method of claim 1, wherein etching the semiconductor layer of the second conductive type further comprises removing the semiconductor layer of the second conductive type formed on a side surface of the semiconductor substrate.

3. The method of claim 1, wherein etching the semiconductor layer of the second conductive type further comprises removing the semiconductor layer of the second conductive type formed on a side surface of the semiconductor substrate, and wherein the method further comprises etching the semiconductor layer of the second conductive type formed on the textured rear surface and the semiconductor layer of the second conductive type formed on the side surface at the same time.

4. The method of claim 1 further comprising:
   forming a front electrode operable to collect current from the front surface, the front electrode being electrically coupled to the semiconductor layer of the second conductive type;
   forming a through-hole electrode disposed at least partially within the via hole and coupled to the front electrode;

forming a back electrode electrically coupled to the rear surface of the semiconductor substrate, the back electrode being isolated from the through-hole electrode; and forming an impurity layer on the rear surface of the semiconductor substrate.

5. The method of claim 4, wherein the through-hole electrode comprises:

an inner via hole electrode disposed within the via hole;

a via front collector covering at least a portion of a front side of the via hole, the via front collector being coupled to the front electrode and the inner via hole electrode; and a via rear collector covering at least a portion of a rear side of the via hole, the via rear collector being coupled to the inner via hole electrode.

6. The method of claim 5, wherein forming the through-hole electrode comprises:

printing the via front collector on the front surface of the semiconductor substrate;

printing the inner via hole electrode into the via hole;

printing the via rear collector on the rear surface of the semiconductor substrate; and co-firing the printed via front collector, inner via hole electrode, and via rear collector.

7. The method of claim 1, further comprising etching a front side edge of the semiconductor layer of the second conductive type formed on the textured front surface.

8. The method of claim 1 further comprising:

removing impurities from the semiconductor substrate after the etching the semiconductor layer of the second conductive type; and depositing a film on the front surface of the semiconductor substrate.

9. The method of claim 8, wherein the film comprises an anti-reflective film.

10. The method of claim 1, wherein generating a via hole through a semiconductor substrate is performed using a laser.

11. The method of claim 1, wherein etching the semiconductor layer of the second conductive type is performed using a chemical solvent, chemical erosion paste, or plasma gas.

12. The method of claim 11, wherein etching using the chemical solvent is performed by infiltrating the semiconductor layer of the second conductive type with the chemical solvent.

13. The method of claim 11, wherein etching using the chemical erosion paste is performed by printing the chemical erosion paste onto the semiconductor layer of the second conductive type.

14. The method of claim 11, wherein etching using the plasma gas is performed by contacting the semiconductor layer of the second conductive type with the plasma gas.

15. The method of claim 1, wherein the first conductive type is N-type, and wherein the second conductive type is P-type.

16. The method of claim 1, wherein the first conductive type is P-type, and wherein the second conductive type is N-type.

17. The method of claim 1, wherein forming the textured front surface on the front surface of the semiconductor substrate comprises etching the front surface of the semiconductor substrate, and wherein forming the textured rear surface on the rear surface of the semiconductor substrate comprises etching the rear surface of the semiconductor substrate.

18. A method for making a light to current converter device, the method comprising:

generating a via hole through a semiconductor substrate of a first conductive type, the via hole extending from a front surface of the semiconductor substrate to a rear surface of the semiconductor substrate;

forming a textured front surface on the front surface of the semiconductor substrate;

forming a textured rear surface on the rear surface of the semiconductor substrate;

depositing a barrier layer on the textured rear surface and an inner surface of the via hole;

forming a semiconductor layer of a second conductive type on the semiconductor substrate, wherein the barrier layer prevents formation of the semiconductor layer of the second conductive type on portions of the textured rear surface and the inner surface of the via hole that are covered by the barrier layer, and wherein the second conductive type is opposite the first conductive type;

removing the barrier layer; and etching the semiconductor layer of the second conductive type, wherein after etching the semiconductor layer of the second conductive type, the semiconductor layer of the second conductive type is located on only the textured front surface.

19. The method of claim 18, wherein the barrier layer is deposited on the textured rear surface such that the barrier layer extends between 0.1 mm to 10 cm from an edge of the via hole.

20. The method of claim 18, wherein the barrier layer is deposited on all of the textured rear surface.

21. The method of claim 18, wherein the barrier layer is deposited on a full inner surface of the via hole.

22. The method of claim 18, wherein etching the semiconductor layer of the second conductive type further comprises removing the semiconductor layer of the second conductive type formed on a side surface of the semiconductor substrate.

23. The method of claim 18, wherein etching the semiconductor layer of the second conductive type further comprises removing the semiconductor layer of the second conductive type formed on a side surface of the semiconductor substrate, and wherein the method further comprises etching the semiconductor layer of the second conductive type formed on the textured rear surface and the semiconductor layer of the second conductive type formed on the side surface at the same time.

24. The method of claim 18, wherein depositing the barrier layer is performed using a printing paste, plasma-enhanced chemical vapor deposition, chemical oxidating, rapid thermal processing, magnetron sputtering, or vacuum evaporating.

25. The method of claim 18, wherein the barrier layer comprises a polymer resin, solicon resin, silicon oxide, silicon nitride, titanium oxide, or zinc oxide.

26. The method of claim 18, wherein removing the barrier layer comprises washing the barrier layer with lye having a temperature between 20-90° C. and a concentration between 0.05%-10%.

27. The method of claim 18 further comprising:

forming a front electrode operable to collect current from the front surface, the front electrode being electrically coupled to the semiconductor layer of the second conductive type;

forming a through-hole electrode disposed at least partially within the via hole and coupled to the front electrode;

forming a back electrode electrically coupled to the rear surface of the semiconductor substrate, the back electrode being isolated from the through-hole electrode; and forming an impurity layer on the rear surface of the semiconductor substrate.

28. The method of claim 27, wherein the through-hole electrode comprises:
an inner via hole electrode disposed within the via hole;
a via front collector covering at least a portion of a front side of the via hole, the via front collector being coupled to the front electrode and the inner via hole electrode; and
a via rear collector covering at least a portion of a rear side of the via hole, the via rear collector being coupled to the inner via hole electrode.

29. The method of claim 28, wherein forming the through-hole electrode comprises:
printing the via front collector on the front surface of the semiconductor substrate;
printing the inner via hole electrode into the via hole;
printing the via rear collector on the rear surface of the semiconductor substrate; and
co-firing the printed via front collector, inner via hole electrode, and via rear collector.

30. The method of claim 18, further comprising etching a front side edge of the semiconductor layer of the second conductive type formed on the textured front surface.

31. The method of claim 18 further comprising:
removing impurities from the semiconductor substrate after the etching the semiconductor layer of the second conductive type; and
depositing a film on the front surface of the semiconductor substrate.

32. The method of claim 31, wherein the film comprises an anti-reflective film.

33. The method of claim 18, wherein generating a via hole through a semiconductor substrate is performed using a laser.

34. The method of claim 18, wherein etching the semiconductor layer of the second conductive type is performed using a chemical solvent, chemical erosion paste, or plasma gas.

35. The method of claim 34, wherein etching using the chemical solvent is performed by infiltrating the semiconductor layer of the second conductive type with the chemical solvent.

36. The method of claim 34, wherein etching using the chemical erosion paste is performed by printing the chemical erosion paste onto the semiconductor layer of the second conductive type.

37. The method of claim 34, wherein etching using the plasma gas is performed by contacting the semiconductor layer of the second conductive type with the plasma gas.

38. The method of claim 18, wherein the first conductive type is N-type, and wherein the second conductive type is P-type.

39. The method of claim 18, wherein the first conductive type is P-type, and wherein the second conductive type is N-type.

40. The method of claim 18, wherein forming the textured front surface on the front surface of the semiconductor substrate comprises etching the front surface of the semiconductor substrate, and wherein forming the textured rear surface on the rear surface of the semiconductor substrate comprises etching the rear surface of the semiconductor substrate.

* * * * *